(12) United States Patent
Shur et al.

(10) Patent No.: US 9,748,440 B2
(45) Date of Patent: Aug. 29, 2017

(54) SEMICONDUCTOR LAYER INCLUDING COMPOSITIONAL INHOMOGENEITIES

(71) Applicant: Sensor Electronic Technology, Inc., Columbia, SC (US)

(72) Inventors: Michael Shur, Latham, NY (US); Rakesh Jain, Columbia, SC (US); Maxim S. Shatalov, Columbia, SC (US); Alexander Dobrinsky, Loudonville, NY (US); Jinwei Yang, Columbia, SC (US); Remigijus Gaska, Columbia, SC (US); Mikhail Gaevski, West Columbia, SC (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

(21) Appl. No.: 15/225,382

(22) Filed: Aug. 1, 2016

(65) Prior Publication Data

US 2016/0343901 A1    Nov. 24, 2016

Related U.S. Application Data

(63) Continuation-in-part of application No. 14/984,342, filed on Dec. 30, 2015, now Pat. No. 9,406,840,
(Continued)

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/007* (2013.01); *H01L 33/18* (2013.01); *H01L 33/382* (2013.01);
(Continued)

(58) Field of Classification Search
CPC . H01L 33/002; H01L 33/0025; H01L 33/025; H01L 33/04; H01L 33/06;
(Continued)

(56) References Cited

U.S. PATENT DOCUMENTS 7,498,182 B1    3/2009    Sampath et al.
7,812,366 B1    10/2010   Sampath et al.
(Continued)

OTHER PUBLICATIONS

Bhattacharyya, A. et et al. "Efficient p-type doping of GaN films by plasma-assisted molecular beam epitaxy," Applied Physics Letters, 2004, 4 pages, vol. 85.
(Continued)

*Primary Examiner* — Bryan Junge
(74) *Attorney, Agent, or Firm* — Labatt, LLC

(57) ABSTRACT

A device comprising a semiconductor layer including a plurality of compositional inhomogeneous regions is provided. The difference between an average band gap for the plurality of compositional inhomogeneous regions and an average band gap for a remaining portion of the semiconductor layer can be at least thermal energy. Additionally, a characteristic size of the plurality of compositional inhomogeneous regions can be smaller than an inverse of a dislocation density for the semiconductor layer.

20 Claims, 33 Drawing Sheets

Related U.S. Application Data which is a continuation-in-part of application No. 14/285,738, filed on May 23, 2014, now Pat. No. 9,281,441.

(60) Provisional application No. 61/826,788, filed on May 23, 2013, provisional application No. 61/943,162, filed on Feb. 21, 2014.

(51) Int. Cl.

| | |
|---|---|
| *H01L 33/18* | (2010.01) |
| *H01L 33/38* | (2010.01) |
| *H01S 5/022* | (2006.01) |
| *H01L 33/30* | (2010.01) |
| *H01S 5/343* | (2006.01) |
| *H01S 5/32* | (2006.01) |
| *H01S 5/34* | (2006.01) |

(52) U.S. Cl.
CPC ............ *H01S 5/0224* (2013.01); *H01L 33/30* (2013.01); *H01L 2224/14* (2013.01); *H01S 5/3209* (2013.01); *H01S 5/3413* (2013.01); *H01S 5/34333* (2013.01)

(58) Field of Classification Search
CPC ....... H01L 33/18; H01L 33/20; H01L 33/382; H01L 33/387
See application file for complete search history.

(56) References Cited

U.S. PATENT DOCUMENTS

| | | | |
|---|---|---|---|
| 2002/0030200 | A1 | 3/2002 | Yamaguchi et al. |
| 2004/0232438 | A1 | 11/2004 | Ogawa |
| 2006/0255364 | A1 | 11/2006 | Saxler et al. |
| 2006/0278880 | A1 | 12/2006 | Lee et al. |
| 2007/0181869 | A1 | 8/2007 | Gaska et al. |
| 2013/0026519 | A1* | 1/2013 | Huang ............... H01L 33/20 257/98 |
| 2013/0270519 | A1 | 10/2013 | Sun et al. |
| 2013/0320299 | A1 | 12/2013 | Li |
| 2014/0064314 | A1 | 3/2014 | Shur et al. |
| 2014/0110754 | A1 | 4/2014 | Jain et al. |

OTHER PUBLICATIONS

Bhattacharyya, A. et al. "High reflectivity and crack-free AlGaN/AlN ultraviolet distributed Bragg reflectors," Jour. of Vacuum Scence and Technology, 2002, 5 pages, vol. 20, No. 3.

Chen, C.H. et al., "Mechanism of enhanced luminescence in InxAlyGa1-x-yN quaternary epilayers," Applied Physics Lettets, Mar. 1, 2004, 3 pages, vol. 84, No. 9.

Chichibu, S. et al., "Luminescences from localized states in InGaN epilayers," Applied Physics Lettets, May 26, 1997, 4 pages, vol. 70, No. 21.

Chichibu, S. et al., "Spatially resolved cathodoluminescence spectra of InGaN quantum wells," Applied Physics Letters, Oct. 20, 1997, 4 pages, vol. 71, No. 16.

Elsass, C.R. et al. "Effects of growth condtions on the incorporation of oxygen in AlGaN layers grown by plasma assisted molecular beam epitaxy," Applied Physics Letters, Nov. 13, 2000, 4 pages, vol. 77, No. 20.

Elsass, C.R. et al. "Influence of Ga flux on the growth and electron transport properties of AlGaN/GaN heterostructures grown by plasma-assisted molecular beam epitaxy" Journal of Crystal Growth, 2001, 8 pages, vol. 233.

Fedler, F. et al. "Strain, morphological, and growth-mode changes in AlGaN single layers at high AlN mole fraction," Journal of Crystal Growth, Jun. 2002, 8 pages, vol. 241, No. 4.

Garrett, G.A. et al. "Defect density dependence of carrier dynamics in AlGaN multiple quantum wells grown on GaN substrates and templates," Phys. Stat. Sol, 2005, 5 pages vol. 2, No. 7.

Hierro, A. et al. "Impact of Ga/N flux ratio on trap states in n-GaN grown by plasma-assisted molecular-beam apitaxy," Applied Physics Letters, Feb. 4, 2002, 4 pages, vol. 80, No. 5.

Heying, B. et al. "Control of GaN surface morphologies using plasma-assisted molecular beam epitaxy," Journal of 4pplied Physics, Aug. 15, 2000, 7 pages, vol. 88, No. 4.

Heying, B. et al. "Optimization of the Electron Mobilites in GaN Grown by Plasma-assisted Molecular Beam Epitaxy," Proc. Int. Workshop on Nitride Semiconductors, IPAP Conf. Series, 2000, 4 pages.

Hirayama, H. et al., "Marked enhancement of 320-360 nm ultraviolet emission in quaternary In x Al y Ga 1-x-y N with In-segregation effect," Applied Physics Letters, Jan. 14, 2002, 4 pages, vol. 80, No. 2.

Huang, D. et al. "Dependence of GAN polarity on the parameters of the buffer layer grown by molecular beam epitaxy," Applied Physics Letters, Jun. 25, 2001, 4 pages, vol. 78, No. 26.

Kazlauskas, K. et al., "Double-scaled potential profile in a group-III nitride alloy revealed by Monte Carlo simulation of exciton hopping," Applied Physics Letters, Nov. 3, 2003, 4 pages, vol. 83, No. 18.

Kim, Y.W. et al., "Dislocation behavior in InGaN/GaN multi-quantum-well structure grown by metalorganic chemical vapor deposition," Applied Physics Letters, May 27, 2002, 4 pages, vol. 80, No. 21.

Kim, H.S. et al. "Time-resolved photoluminescence studies of Al x Ga 1-x N alloys," Applied Physics Lettets, Mar. 6, 2000, 4 pages, vol. 76, No. 10.

Klausing, H. et al. "Improved quality of plasma assisted MBE-grown GaN/AlGaN quantum wells revealed by two-wavelength excited photoluminescence," Phys. Stat. Sol., 2003, 4 pages, vol. 0, No. 7.

Klausing, H. et al. "Electron Beam Pumped Nitride Vertical Cavity Surface Emitting Structures with AlGaN/AlN DBR Mirrors," Phys. Stat. Sol., 2002, 5 pages, vol. 194, No. 2.

Kobayashi, N. et al. "In-situ optical monitoring of surface morphology and stoichiomety during GaN metal organic vapor phase epitaxy," Applied Surface Science, 2000, 7 pages, vol. 159-160.

Kuek, J.J. et al. "Effects of Band Tail Absorption on AlGaN-Based Ultraviolet Photodiodes," Phys. Stat. Sol., 2001, 6 pages, vol. 188, No. 1.

Lin et al.' "Dependence of composition fluctuation on indium content in InGaN/GaN multiple quantum wells," Applied hysics Letters, Nov. 6,2000, 4 pages, vol. 77, No. 19.

Maeda, K., Chapter 9, "Radiation-Enhanced Dislocation Glide: The Current Status of Research," Materials and Reliability Handbook for Semiconductor Optical and Electron Devices, 2013, 19 pages.

Mayes, K. et al. "High-power 280 nm AlGaN light-emitting diodes based on an asymmetric single-quantum well," Applied Physics Letters, Feb. 16, 2004, 4 pages, vol. 84, No. 7.

Monroy, E. et al., "Molecular-beam epitaxial growth and characterization of quaternary III-nitride compounds," Journal of Applied Physics, Sep. 1, 2003, 8 pages, vol. 94, No. 5.

Moustakas, T. et al., Gallium Nitride II (GaN II), Semiconductors and Semimetals, vol. 57 (eds. J.I Pankove and T. D. Moustakas) Academic Press, Publisher Summaries of Chapters, San Diego, 1999.

Ryu, M. et al., "Luminescence mechanisms in quaternary Al x In y Ga 1-x-y N materials," Applied Physics Letters, May 20, 2002, 4 pages, vol. 80, No. 20.

Sampath, A.V. et al. "Effect of Ga-rich growth conditions on the optical properties of GaN films grown by plasma assisted molecular beam epitaxy," Journal of Vacuum Science and Technoly, 2004, 5 pages, vol. 22 , No. 3.

Sun, Y. et al., "Carrier dynamics of high-efficiency green light emission in graded-indium-content InGaN/GaN quantum wells: An important role of effective carrier transfer," Applied Physics Letters, Jan. 5, 2004, 4 pages, vol. 84, No. 1.

Tamulaitis, G. et al., "Optical bandgap formation in AlInGaN alloys," Applied Physics Letters, Oct. 2, 2000, 4 pages, vol. 77, No. 14.

(56) References Cited

OTHER PUBLICATIONS

Wraback, M. et al. "Time-Resolved Reflectivity Studies of Carrier Dynamics as a Function of Al content in AlGaN Alloys," Phys. Stat. Sol., 2001, 4 pages, vol. 188, No. 2.
Junge, B., U.S. Appl. No. 14/285,738, Notice of Allowance2, Oct. 27, 2015, 16 pages.
Junge, B., U.S. Appl. No. 14/285,738, Notice of Allowance, Jul. 17, 2015, 11 pages.
Junge, B., U.S. Appl. No. 14/285,738, Office Action 1, Feb. 10, 2015, 20 pages.
Junge, B., U.S. Appl. No. 14/984,342, Notice of Allowance, Mar. 31, 2016, 17 pages.

* cited by examiner

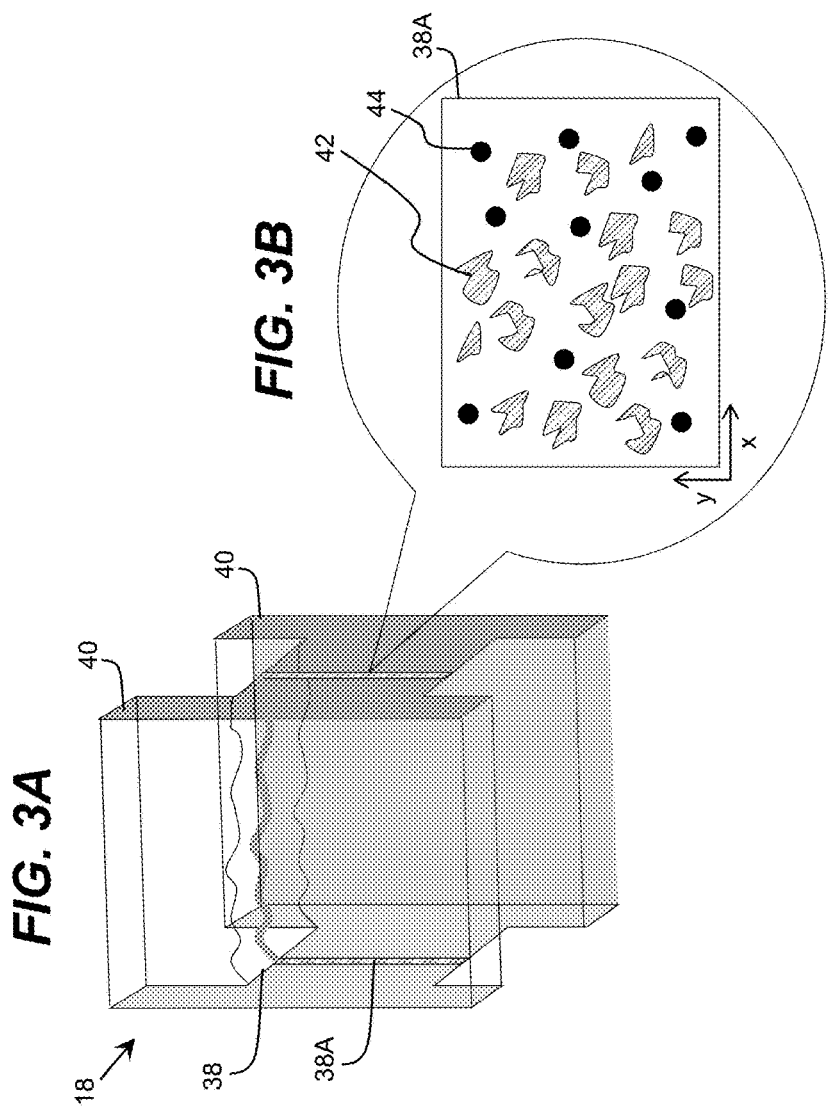

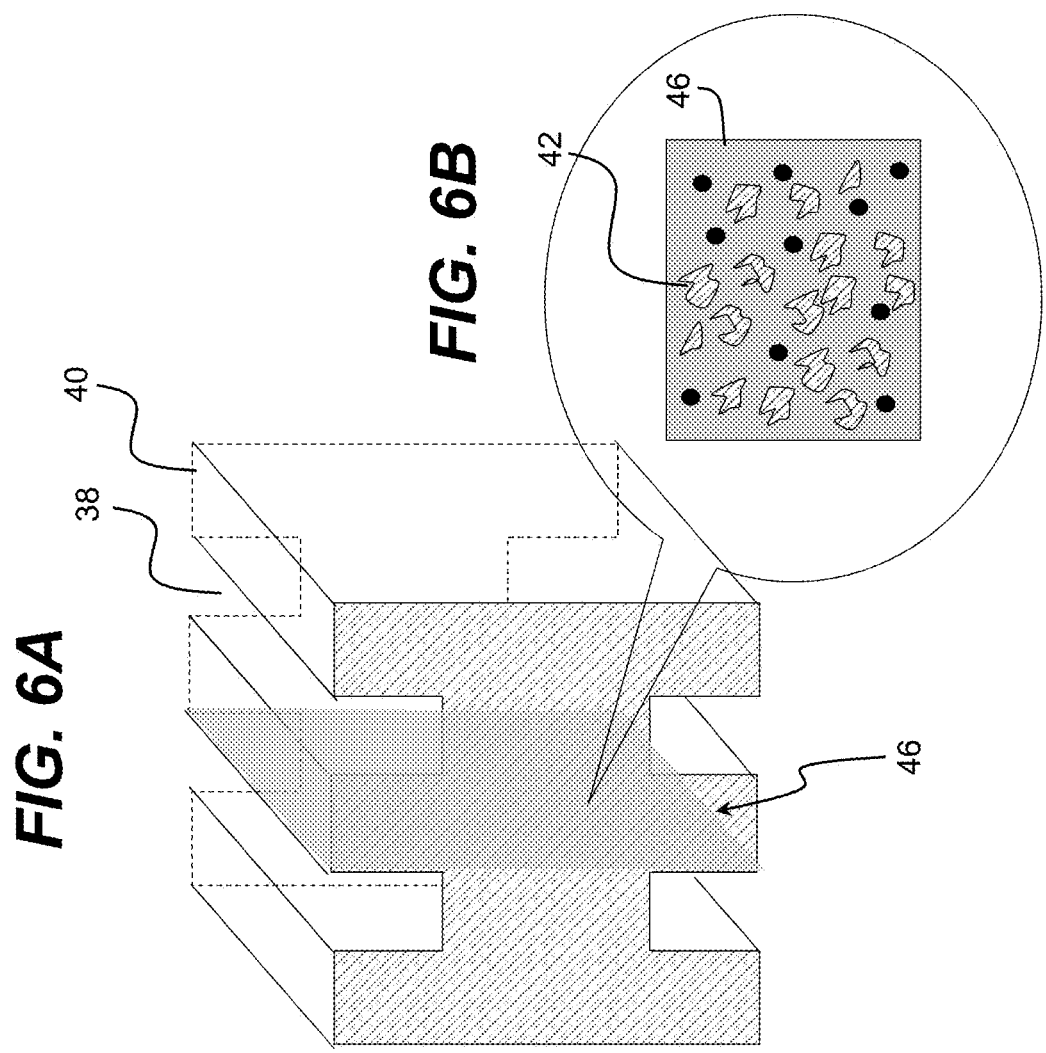

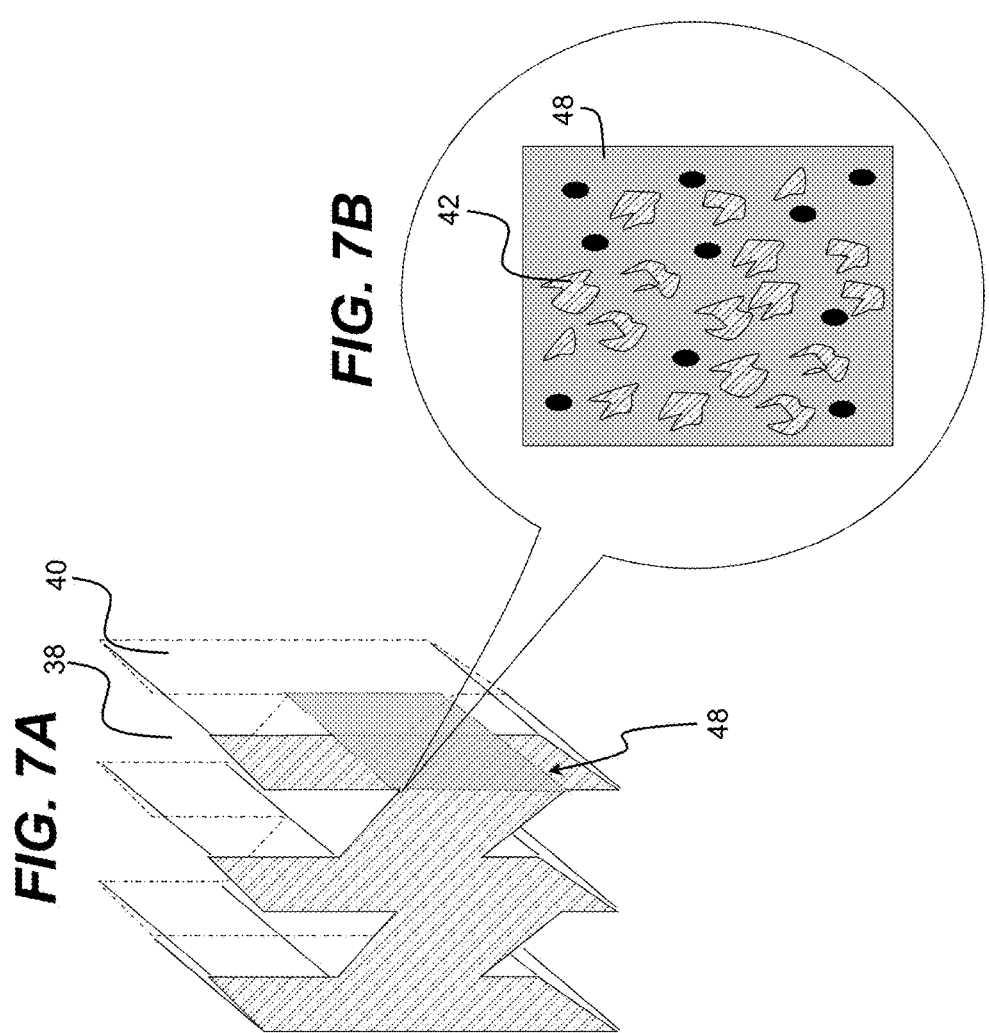

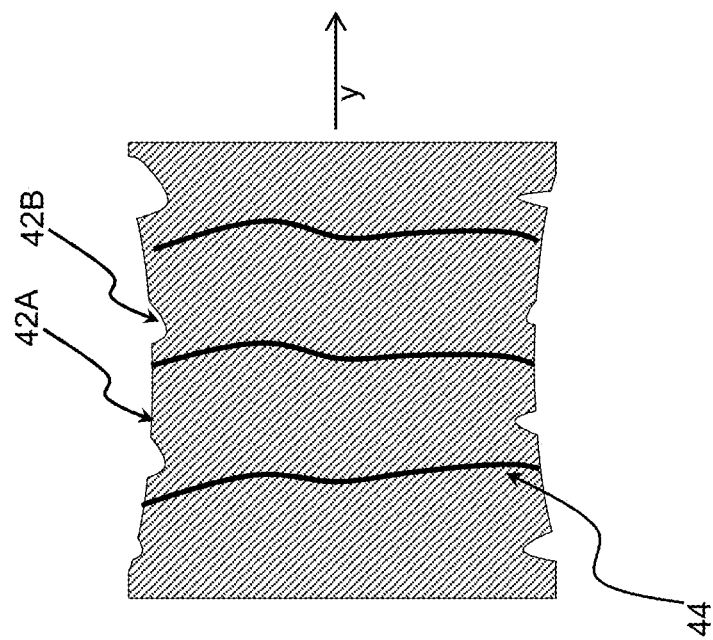
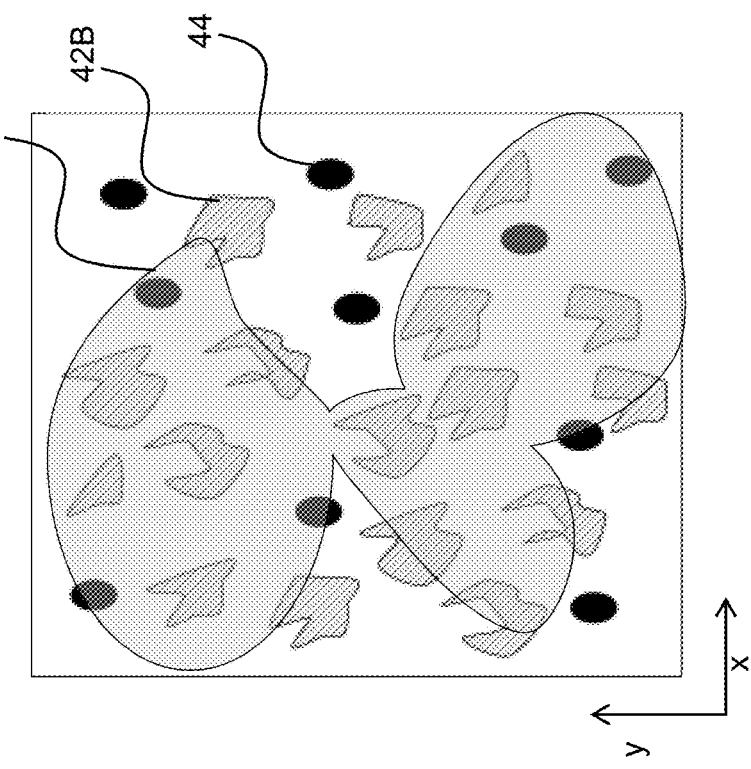

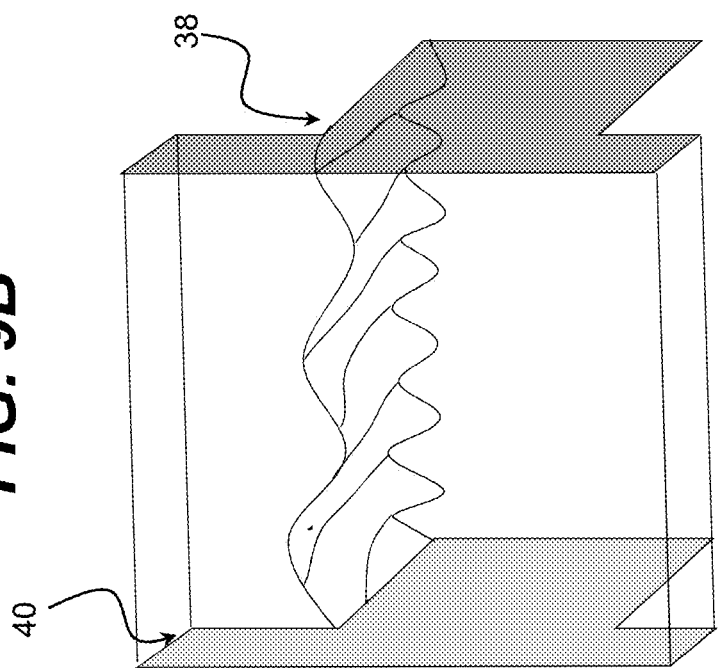
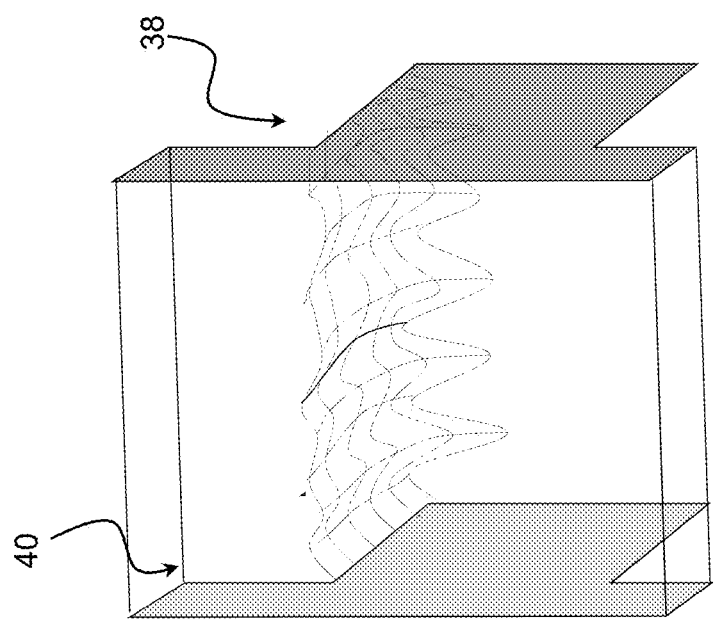

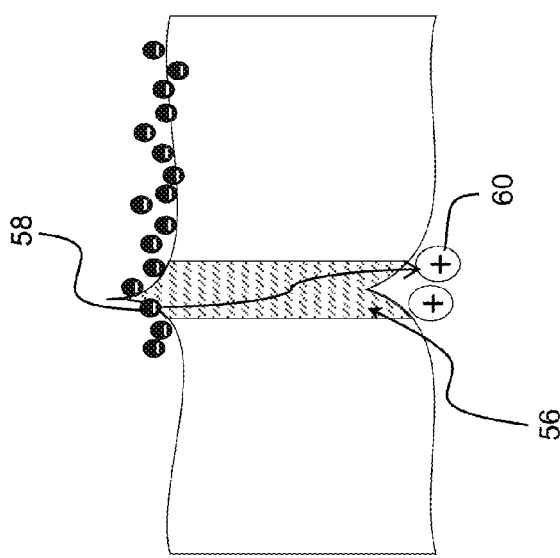
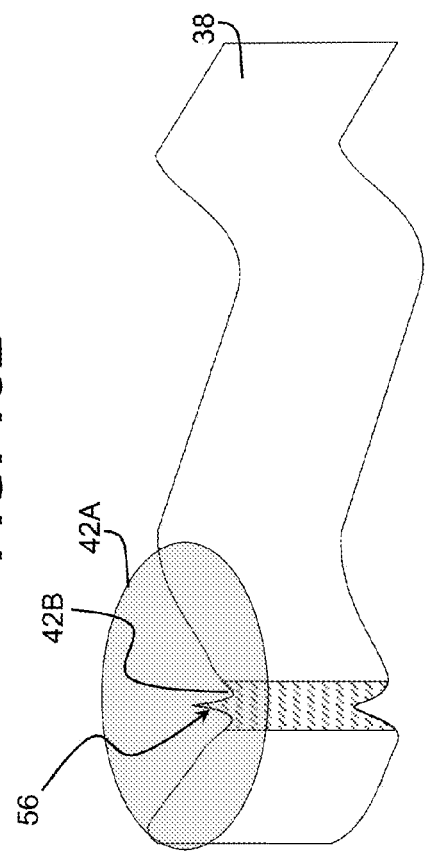
FIG. 13A
FIG. 13B

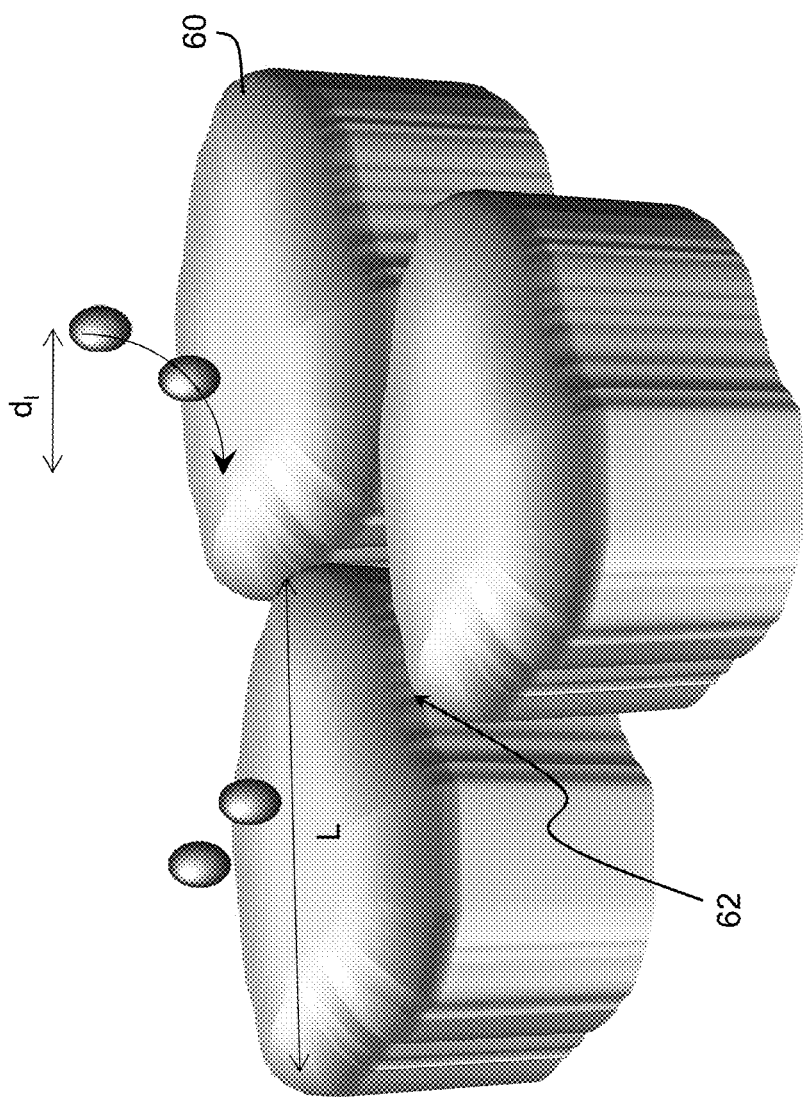

FIG. 18A

| Tensile Layer | Compressive Layer | Tensile Layer | Compressive Layer | Tensile Layer | Compressive Layer | Buffer Layer | Foreign Substrate |

FIG. 18B

| Compressive Layer | Tensile Layer | Compressive Layer | Tensile Layer | Compressive Layer | Tensile Layer | Buffer Layer | Foreign Substrate |

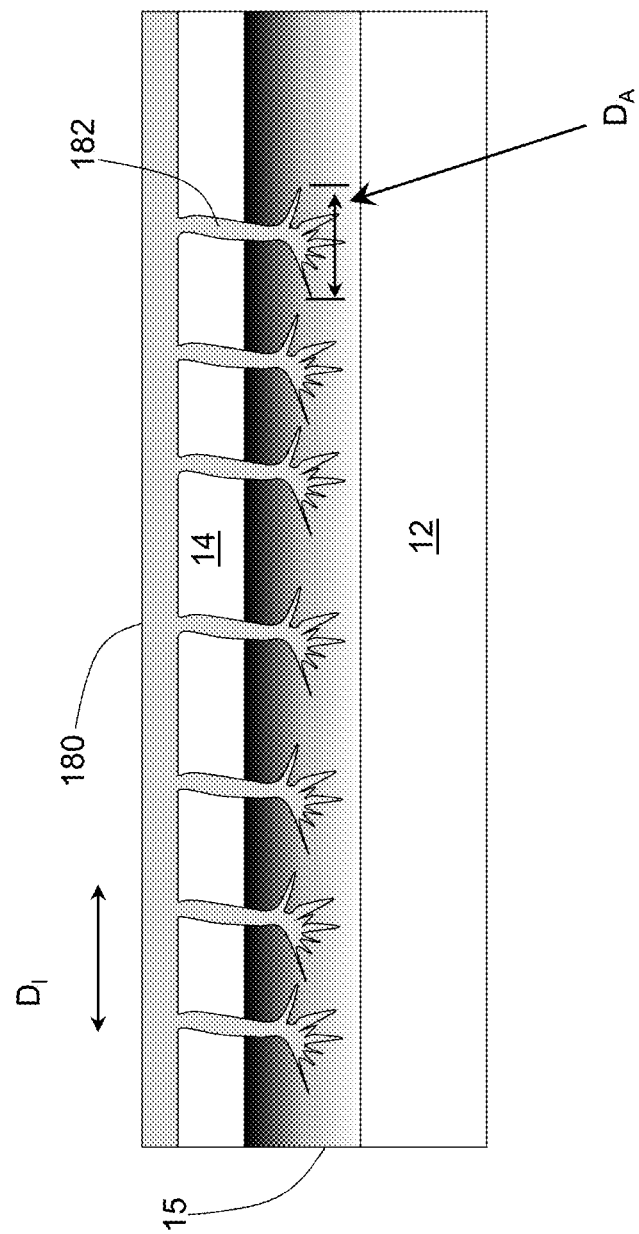

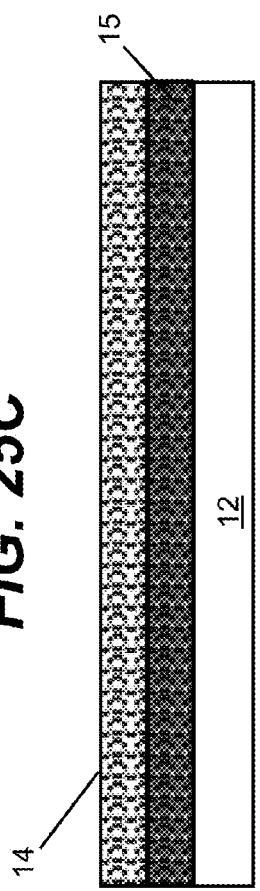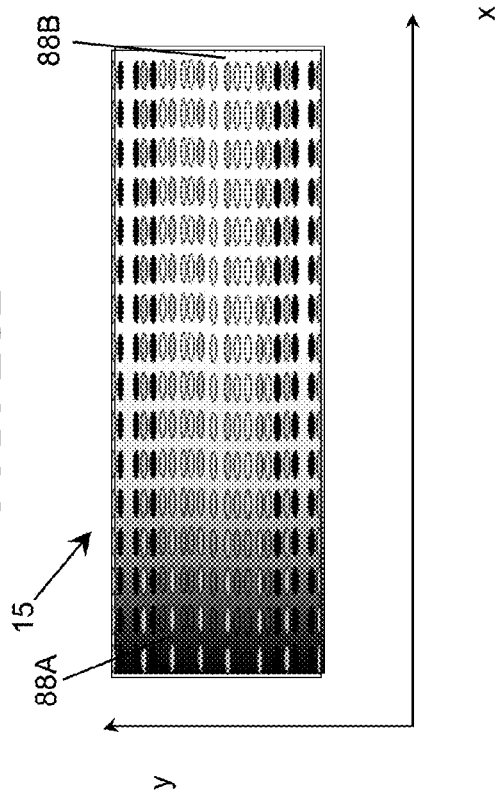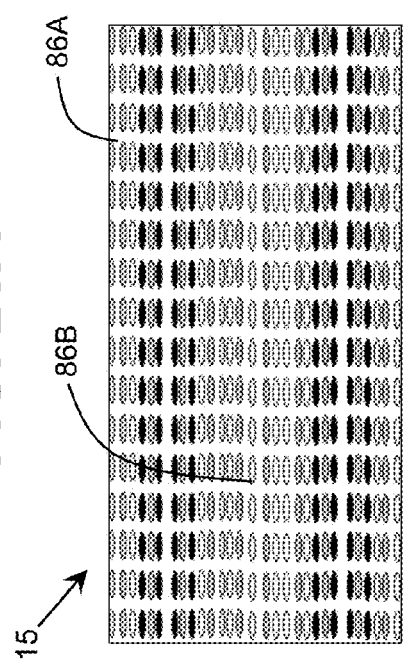

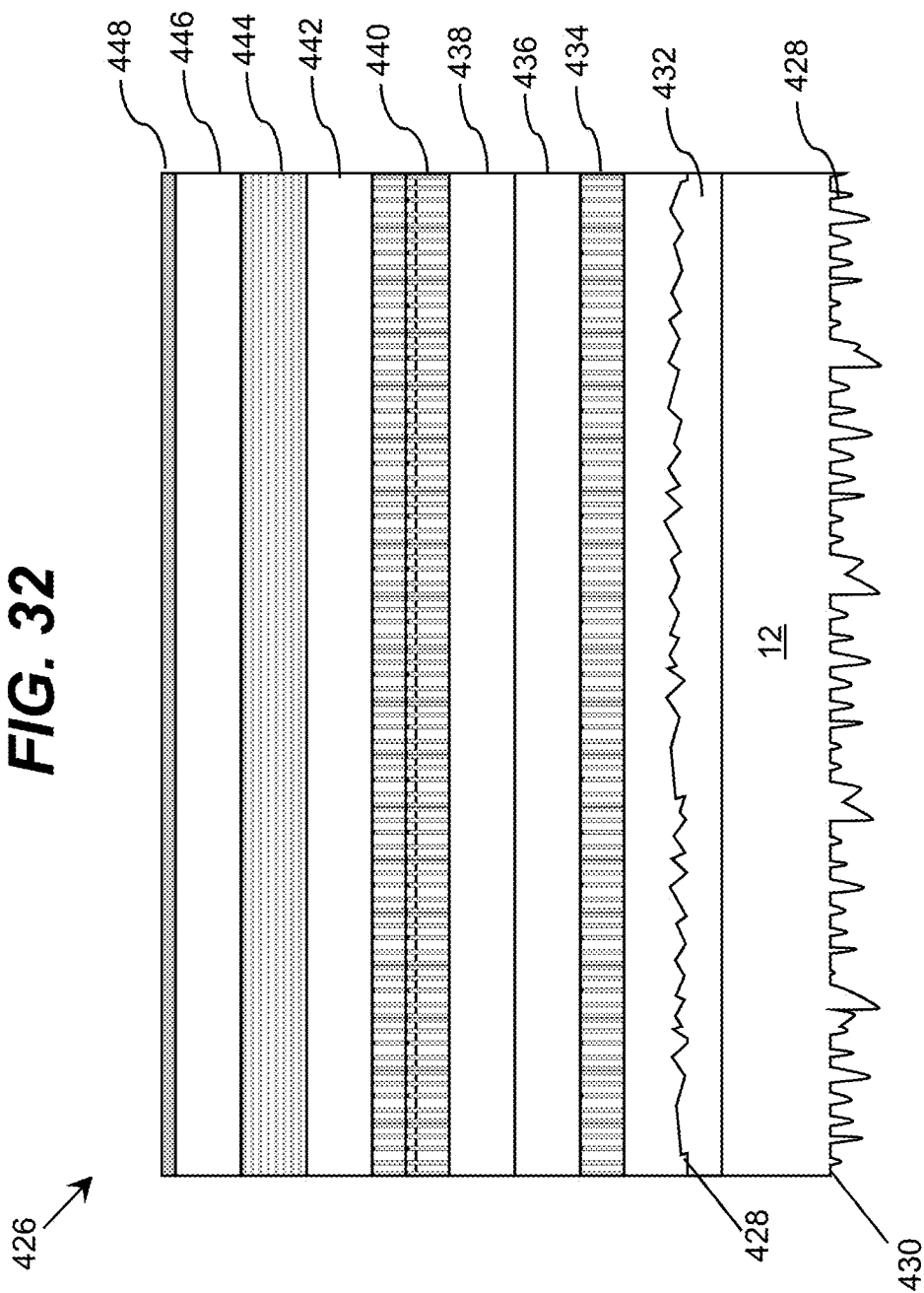

SEMICONDUCTOR LAYER INCLUDING COMPOSITIONAL INHOMOGENEITIES

REFERENCE TO RELATED APPLICATIONS

The current application is a continuation-in-part of U.S. application Ser. No. 14/984,342, entitled "Semiconductor Layer Including Compositional Inhomogeneities," which was filed on 30 Dec. 2015, which is a continuation-in-part application of U.S. application Ser. No. 14/285,738, titled "Semiconductor Layer Including Compositional Inhomogeneities," which was filed on 23 May 2014, and which claims the benefit of U.S. Provisional Application No. 61/826,788, titled "Semiconductor Layer with Compositional Inhomogeneities," which was filed on 23 May 2013, and U.S. Provisional Application No. 61/943,162, titled "Group III Nitride Semiconductor Composition and Ultraviolet Optoelectronic Device Containing the Same," which was filed on 21 Feb. 2014, all of which are hereby incorporated by reference in their entirety to provide continuity of disclosure.

TECHNICAL FIELD

The disclosure relates generally to emitting devices, and more particularly, to an emitting device including a semiconductor layer with compositional inhomogeneous regions.

BACKGROUND ART

Compositional band fluctuations were first considered for indium-gallium-nitride (InGaN) systems. It was found that the material properties of InGaN alloys change as the amount of indium in the alloy is increased. With the proper growth conditions, however, it was discovered that a material could be grown in which the indium did not incorporate uniformly throughout the InGaN layer (i.e., the material had areas of high and low concentrations of indium spread throughout). These compositional fluctuations, also known as localized inhomogeneities, result in carrier localization and lead to an enhancement in the radiative efficiency despite the high dislocation density. The discovery of the effects of the localized inhomogeneities enabled the development of commercially successful blue InGaN-based LEDs and laser diodes (LDs). It has been reported that the intense red-shifted photoluminescence (PL) peaks observed in InGaN alloys at room temperature result from the recombination of excitons localized at potential minima originating from large compositional fluctuations.

Similar localization effects were observed for aluminum-indium-gallium-nitride (AlInGaN) and aluminum-gallium-nitride (AlGaN) systems. The use of aluminum gallium nitride ($Al_xGa_{1-x}N$), as opposed to InAlGaN, is currently preferred as the base material for manufacturing ultraviolet (UV) light emitting diode (LED) devices for ultraviolet semiconductor optical sources operating at wavelengths between 260 to 360 nanometers (nm) due to its tunable band gap from 3.4 eV to 6.2 eV.

One approach discloses a semiconductor structure containing compositional fluctuations as well as a method for depositing group III-nitride films called molecular beam epitaxy (MBE). The structure comprises self-assembled nanometer-scale localized compositionally inhomogeneous regions. Within these regions, the luminescence occurs due to radiative recombination of carriers in the self-assembled nanometer-scale localized compositionally inhomogeneous regions having band-gap energies less than surrounding material. Further, another approach discloses self-assembled nanometer-scale localized compositionally inhomogeneous regions that include a fine scale facetted surface morphology or pits with diameters of about ten to one hundred nanometers. The approach also discloses the semiconductor device comprising of such semiconductor structures.

Group-III nitride based semiconductors are materials of choice for ultraviolet light emitting diodes, photomultipliers and photodiodes. Currently, wall plug operating efficiencies of deep ultraviolet light emitting devices reach only a few percent and a large effort is devoted to improving their efficiency.

Similar to InGaN-based semiconductor devices, carrier localization plays an important role in light emission from devices based on AlGaN semiconductor layers. Even though these materials are typically grown with a large number of threading dislocations and point defects, emission efficiency is higher than anticipated and radiative lifetimes obtained from photoluminescence studies are smaller than predicted by theory. This effect can be attributed to the carriers being isolated from nonradiative recombination centers due to localization in sites containing a smaller band gap than the surrounding semiconductor material.

FIG. 1 shows a schematic of compositional fluctuation according to the prior art. During the initial growth stage, adjacent small islands, from which the growth starts, coalesce into larger grains. As the islands enlarge, Ga adatoms, having a larger lateral mobility than Al adatoms, reach the island boundaries more rapidly. As a result, the Ga concentration in the coalescence regions is higher than in the center of the islands. The composition pattern, which is formed during the coalescence, is maintained as the growth proceeds vertically. As a result of the coalescence, the domain boundaries usually contain extended defects that form to accommodate the relative difference in crystal orientation among the islands. Even in layers with smooth surfaces containing elongated layer steps, screw/mixed dislocations occur due to the local compositional inhomogeneities.

SUMMARY OF THE INVENTION

This Summary of the Invention introduces a selection of certain concepts in a brief form that are further described below in the Detailed Description of the Invention. It is not intended to exclusively identify key features or essential features of the claimed subject matter set forth in the Claims, nor is it intended as an aid in determining the scope of the claimed subject matter.

In light of the above, the inventors recognize that compositional inhomogeneous regions in a semiconductor layer of a device can allow for increasing radiative recombination of carriers and decreasing nonradiative recombination time by preventing electrons from reaching threading dislocation cores.

Aspects of the invention provide a device comprising a semiconductor layer including a plurality of compositional inhomogeneous regions, which can be configured to, for example, improve internal quantum efficiency (IQE) and the overall reliability of the device. A difference between an average band gap for the plurality of compositional inhomogeneous regions and an average band gap for a remaining portion of the semiconductor layer can be at least thermal energy. Additionally, a characteristic size of the plurality of compositional inhomogeneous regions can be smaller than an inverse of a dislocation density for the semiconductor layer.

A first aspect of the invention provides a device comprising: a semiconductor layer comprising a plurality of compositional inhomogeneous regions, wherein a difference between an average band gap for the plurality of compositional inhomogeneous regions and an average band gap for a remaining portion of the semiconductor layer is at least thermal energy, and wherein a characteristic size of the plurality of compositional inhomogeneous regions is smaller than an inverse of a dislocation density for the semiconductor layer.

A second aspect of the invention provides a device comprising: a semiconductor structure including an active region, wherein the active region comprises a multiple quantum well structure including: a plurality of barriers alternating with a plurality of quantum wells, wherein at least one of: a barrier in the plurality of barriers or a quantum well in the plurality of quantum wells includes a plurality of compositional inhomogeneous regions, wherein a difference between an average band gap for the plurality of compositional inhomogeneous regions and an average band gap for a remaining portion of the semiconductor layer is at least thermal energy, and wherein a characteristic size of the plurality of compositional inhomogeneous regions is smaller than an inverse of a dislocation density for the semiconductor layer.

A third aspect of the invention provides a method comprising: forming an active region of a semiconductor structure, wherein the active region comprises a light emitting heterostructure, the forming including: forming a plurality of barriers alternating with a plurality of quantum wells, wherein forming at least one of: a barrier in the plurality of barriers or a quantum well in the plurality of quantum wells includes forming a plurality of compositional inhomogeneous regions, wherein an average band gap for the plurality of compositional inhomogeneous regions exceeds a thermal energy of a remaining portion of the semiconductor layer and a characteristic size for each compositional inhomogeneous region is smaller than an inverse of a dislocation density.

A fourth aspect of the invention provides a device, comprising: a semiconductor layer comprising a plurality of compositional inhomogeneous regions, wherein a difference between an average band gap for the plurality of compositional inhomogeneous regions and an average band gap for a remaining portion of the semiconductor layer is at least thermal energy, and wherein a characteristic size of the plurality of compositional inhomogeneous regions is smaller than an inverse of a dislocation density for the semiconductor layer.

A fifth aspect of the invention provides a device, comprising: a semiconductor structure including an active region, wherein the active region comprises a multiple quantum well structure including: a plurality of barriers alternating with a plurality of quantum wells, wherein at least one of: a barrier in the plurality of barriers or a quantum well in the plurality of quantum wells includes a plurality of compositional inhomogeneous regions, wherein a difference between an average band gap for the plurality of compositional inhomogeneous regions and an average band gap for a remaining portion of the semiconductor layer is at least thermal energy, and wherein a characteristic size of the plurality of compositional inhomogeneous regions is smaller than an inverse of a dislocation density for the semiconductor layer.

A sixth aspect of the invention provides a method, comprising: forming an active region of a semiconductor structure, wherein the active region comprises a light emitting heterostructure, the forming including: forming a plurality of barriers alternating with a plurality of quantum wells, wherein forming at least one of: a barrier in the plurality of barriers or a quantum well in the plurality of quantum wells includes forming a plurality of compositional inhomogeneous regions, wherein an average band gap for the plurality of compositional inhomogeneous regions exceeds a thermal energy of a remaining portion of the at least one of the barrier or the quantum well, and a characteristic size for each compositional inhomogeneous region is smaller than an inverse of a dislocation density.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3A shows a hybrid structure/band diagram corresponding to a portion of an active region of an illustrative emitting device, while FIG. 3B shows a plane of the quantum well within the active region of the device according to an embodiment.

FIG. 4A shows an illustrative plane within a multiple quantum well structure for a device according to an embodiment, while

FIG. 6A shows a hybrid structure/band diagram of an illustrative multiple quantum well structure according to an embodiment, while FIG. 6B shows a plane at an interface between a quantum well and a barrier within the illustrative multiple quantum well structure according to an embodiment.

FIG. 7A shows a hybrid structure/band diagram of an illustrative multiple quantum well structure according to an embodiment, while FIG. 7B shows a plane of a tilted quantum well within the illustrative multiple quantum well structure according to an embodiment.

FIG. 8A shows additional details of a hybrid structure/band diagram of an illustrative plane within a multiple quantum well structure of a device according to an embodiment, while FIG. 8B shows an illustrative band gap map for the plane as a function of the y-axis according to an embodiment.

FIGS. 9A and 9B show band diagrams of portions of illustrative multiple quantum well structures according to embodiments.

FIGS. 13A and 13B show band diagrams of illustrative quantum wells according to embodiments.

FIG. 17 shows a portion of an illustrative layer according to an embodiment.

FIGS. 18A and 18B show illustrative strain modulation for reducing threading dislocations for a device according to an embodiment.

FIG. 24 shows an illustrative contact including a plurality of metallic protrusions to a semiconductor layer including a plurality of compositional inhomogeneous regions according to an embodiment.

FIGS. 25A-25C show illustrative etched surfaces of a semiconductor layer according to embodiments.

FIGS. 26A and 26B show illustrative etched surfaces of a semiconductor layer with non-uniform etching according to embodiments.

FIG. 32 shows an illustrative semiconductor heterostructure grown over a substrate having roughness elements according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a device comprising a semiconductor layer including a plurality of compositional inhomogeneous regions, which can be configured to, for example, improve internal quantum efficiency (IQE) and the overall reliability of the device. A difference between an average band gap (e.g., an energy difference between a top of the valence band and a bottom of the conduction band in the semiconductor) for the plurality of compositional inhomogeneous regions and an average band gap for a remaining portion of the semiconductor layer can be at least thermal energy. Additionally, a characteristic size of the plurality of compositional inhomogeneous regions can be smaller than an inverse of a dislocation density for the semiconductor layer. As used herein, a depth of a compositional inhomogeneous region is defined as a difference between the conductive band energy level at the location of the compositional inhomogeneous region and the average conductive band energy level, which is the average between the hills and valleys of the energy landscape of the semiconductor layer. As also used herein, a lateral area of the compositional inhomogeneous regions comprises the physical area corresponding to the location of the compositional inhomogeneous region. As used herein, unless otherwise noted, the term "set" means one or more (i.e., at least one) and the phrase "any solution" means any now known or later developed solution.

Figure 1:
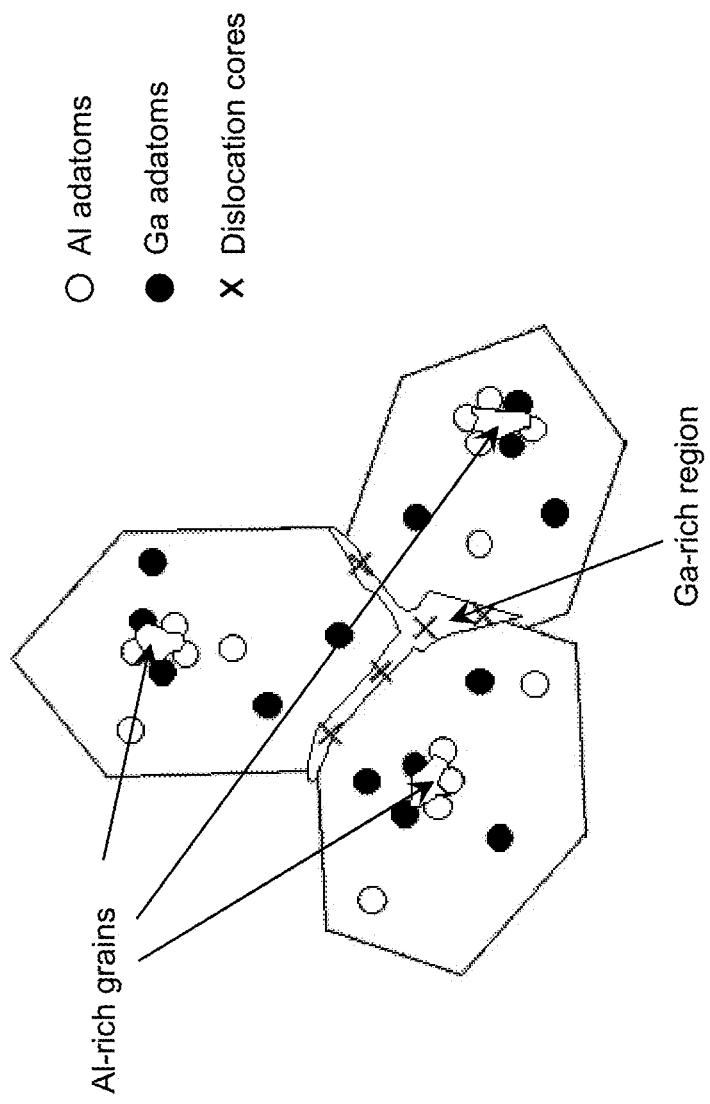
FIG. 1 shows a schematic of compositional fluctuation according to the prior art.
Figure 2:
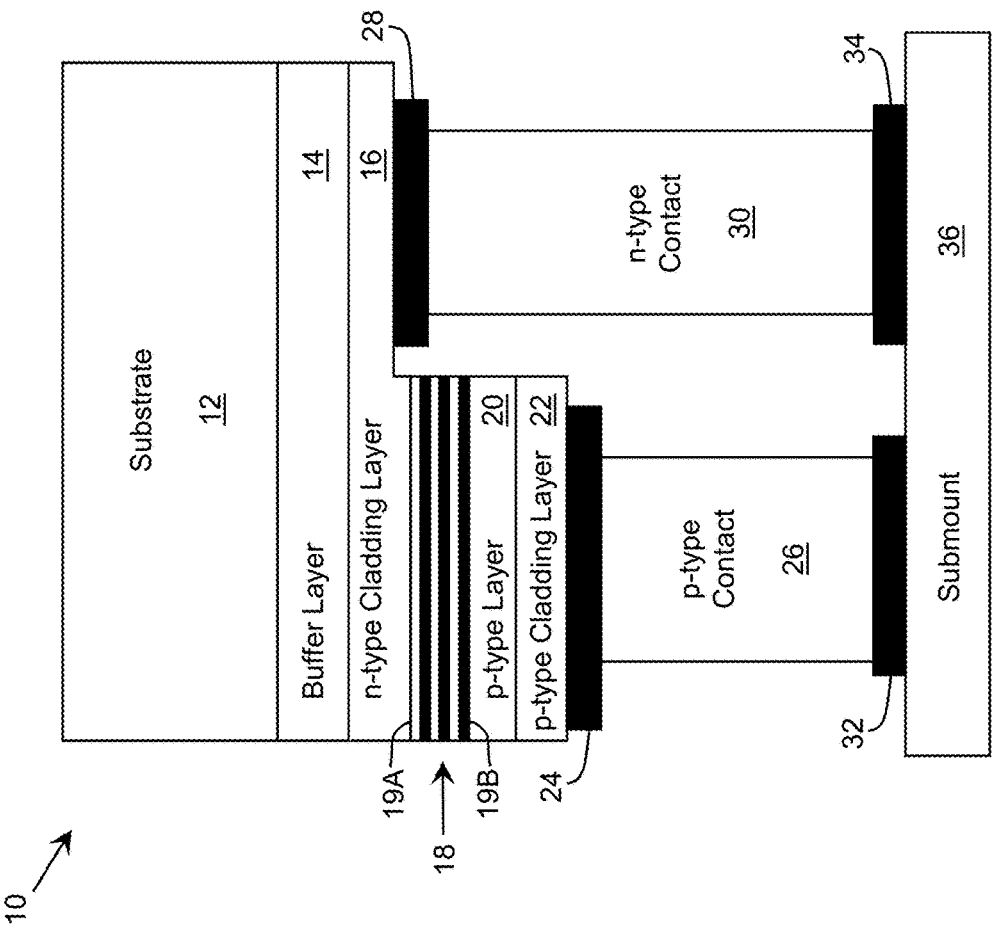
FIG. 2 shows a schematic structure of an illustrative emitting device according to an embodiment.

Turning to the drawings, FIG. 2 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD) or a photo-detector. When operated as an emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like. In an embodiment, the device is configured to emit radiation having a dominant wavelength within the ultraviolet range of wavelengths. In a more specific embodiment, the dominant wavelength is within a range of wavelengths between approximately 210 and approximately 350 nanometers.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be transparent (e.g., semi-transparent or transparent) to the electromagnetic radiation generated by the active region 18. For example, the p-type cladding layer 22 and/or the p-type contact 26 can comprise a short period superlattice lattice structure, such as a transparent magnesium (Mg)-doped AlGaN/AlGaN short period superlattice structure (SPSL). Furthermore, the p-type contact 26 and/or the n-type contact 30 can be reflective of the electromagnetic radiation generated by the active region 18. In another embodiment, the n-type cladding layer 16 and/or the n-type contact 30 can be formed of a short period superlattice, such as an AlGaN SPSL, which is transparent to the electromagnetic radiation generated by the active region 18.

As used herein, a layer is transparent to radiation of a particular wavelength when the layer allows a significant amount of the radiation radiated at a normal incidence to an interface of the layer to pass there through. For example, a layer can be configured to be transparent to a range of radiation wavelengths corresponding to a peak emission wavelength for the light (such as ultraviolet light or deep ultraviolet light) emitted by the active region 18 (e.g., peak emission wavelength+/−five nanometers). As used herein, a layer is transparent to radiation if it allows more than approximately five percent of the radiation to pass there through. In a more particular embodiment, a transparent layer is configured to allow more than approximately ten percent of the radiation to pass there through. Similarly, a layer is reflective when the layer reflects at least a portion of the relevant electromagnetic radiation (e.g., light having wavelengths close to the peak emission of the active region). In an embodiment, a reflective layer is configured to reflect at least approximately five percent of the radiation. In a more particular embodiment, a reflective layer has a reflectivity of at least thirty percent for radiation of the particular wavelength radiated normally to the surface of the layer. In a more particular embodiment, a highly reflective layer has a reflectivity of at least seventy percent for radiation of the particular wavelength radiated normally to the surface of the layer.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, as described herein, one or more of the semiconductor layers of the device 10 can comprise nanoscale and/or micron-scale localized compositional and/or doping inhomogeneous regions along the lateral dimensions of the device die. Inclusion of the inhomogeneous regions in one or more of the semiconductor layers of the device 10 can result in an improvement in the efficiency of the device 10. The inhomogeneous regions can be included in any layer of the semiconductor device 10. To this extent, the inhomogeneous regions can be included in a superlattice region, a nucleation region, a buffer layer, a cladding layer, an active region, and/or the like, of the device 10. In an embodiment, the inhomogeneities are incorporated into one or more injection layers, such as the n-type cladding layer 16, the p-type layer 20, the p-type cladding layer 22, the n-type contact 30, the p-type contact 26, and/or the like.

Additional aspects are shown and described in conjunction with a quantum well, such as a quantum well included in the active region 18 of the device 10, including inhomogeneous regions as an illustrative embodiment. Turning to FIGS. 3A and 3B, a hybrid structure/band diagram corresponding to a portion of the active region 18 (e.g., a multiple quantum well structure including a plurality of quantum wells alternating with a plurality of barriers) according to an embodiment is shown. In FIG. 3A, the multiple quantum well structure of the active region 18 is shown including only one quantum well 38 between two barriers 40. However, it is understood that a single quantum well 38 is shown for clarity, and the quantum well structure of the active region 18 can include any number of quantum wells alternating with any number of barriers.

Figure 5:
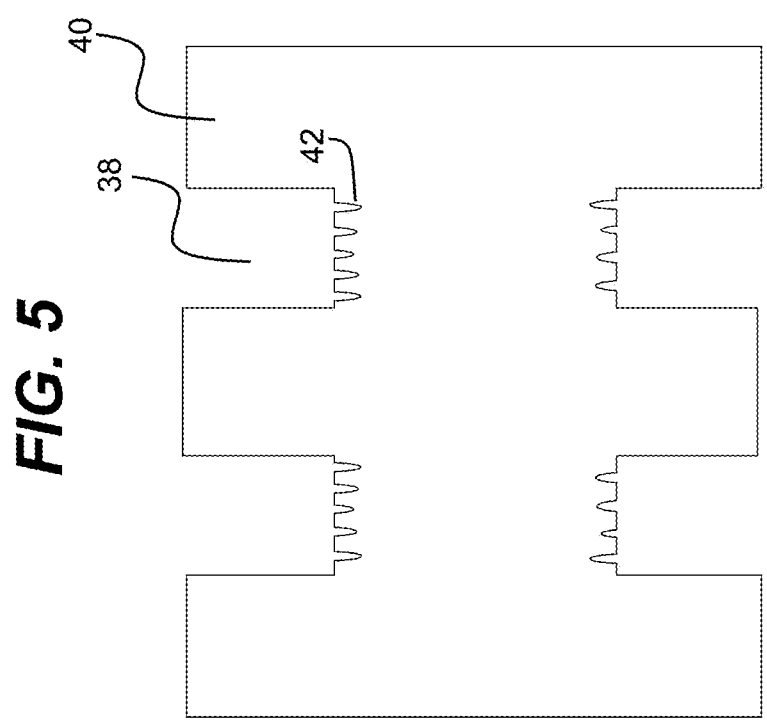
FIG. 5 shows a hybrid structure/band diagram of an illustrative multiple quantum well structure according to an embodiment.

FIG. 3B shows a plane 38A within the quantum well 38 according to an embodiment. The plane 38A includes a plurality of compositional inhomogeneous regions 42 and a plurality of threading dislocations 44. As shown, the compositional inhomogeneous regions 42 can be in the plane 38A of the quantum well 38. In an embodiment, the in-plane dimensions of the inhomogeneous regions 42 are significantly larger than a thickness of the quantum well 38 (e.g., approximately a few nanometers). However, it is understood that the compositional inhomogeneous regions 42 also can be across the thickness of a quantum well 38 (FIG. 5) and/or at an interface between a quantum well 38 and a barrier 40 (FIGS. 6A and 6B). The plurality of compositional inhomogeneous regions 42 can form localized variations in the band gap of the quantum well 38.

Figure 4B:
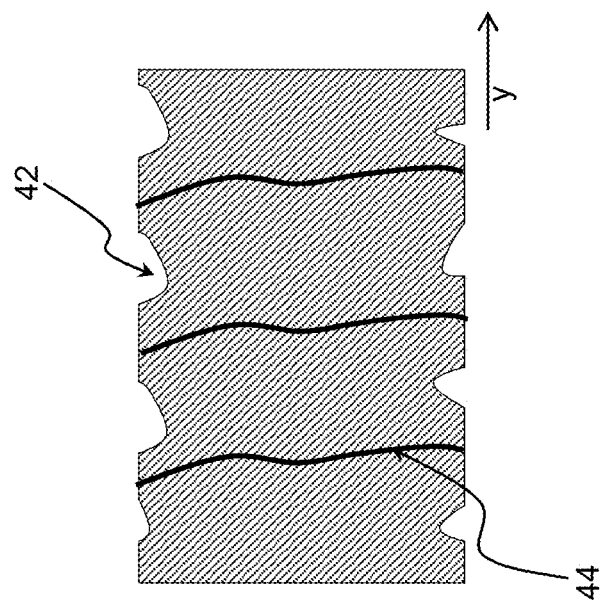
FIG. 4B shows an illustrative band gap map for the plane as a function of the y-axis according to an embodiment.
Figure 4A:
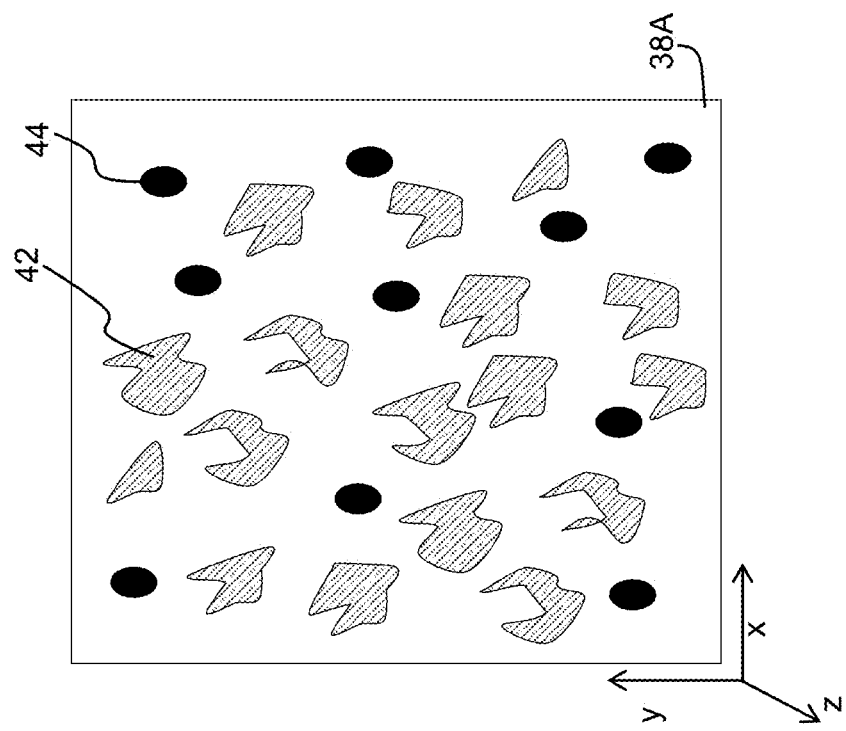

FIG. 4B shows an illustrative band gap map as a function of the y-axis for a location (x, z) on a plane 38A of a quantum well shown in FIG. 4A. As shown in FIG. 4A, the quantum well plane 38A includes a plurality of compositional inhomogeneous regions 42 and a plurality of threading dislocations 44. As seen in FIG. 4B, the band gap for each of the plurality of compositional inhomogeneous regions 42 is less than the band gap of the remaining portion of the quantum well. Furthermore, the plurality of compositional inhomogeneous regions 42 are located between the threading dislocations 44.

Inclusion of the plurality of compositional inhomogeneous regions 42 in a quantum well can enhance radiative recombination, which can improve IQE, delay non-radiative recombination, and/or the like. The plurality of compositional inhomogeneous regions 42 can be located away from the threading dislocations 44 and their corresponding concentration areas, so that a diffusion length of an electron before capture at a localized compositional inhomogeneous region 42 is smaller than a characteristic distance to the threading dislocations. The delay in non-radiative recombination can be achieved by preventing the electrons from reaching the cores of the threading dislocations 44.

In an embodiment, an average band gap for the plurality of compositional inhomogeneous regions 42 is less than an average band gap of the remaining portion of the quantum well 38 by at least half of a thermal voltage multiplied by a carrier charge. In a further embodiment, a difference between an average band gap for the plurality of compositional inhomogeneous regions 42 and an average band gap for a remaining portion of the semiconductor layer (e.g., quantum well 38) is at least thermal energy, e.g., at least 26 meV at room temperature.

In an embodiment, e.g., to increase the IQE of a device, the characteristic size (e.g., the square root of the average lateral area) of the plurality of compositional inhomogeneous regions 42 is smaller than an inverse of a threading dislocation density for the quantum well 38. The characteristic size of the compositional inhomogeneous regions 42 can be calculated, for example, as $1/N_{dis}^{0.5}$, where $N_{dis}$ is the dislocation density per unit area. In an embodiment, the dislocation density per unit area is on the order of $10^8$ cm$^{-2}$ for samples grown using a metalorganic chemical vapor deposition solution. Additionally, a characteristic distance between threading dislocations 44 can be greater than a smallest size for a compositional inhomogeneous region 42. Furthermore, a lateral area for the plurality of compositional inhomogeneous regions 42 can be smaller than a square of the characteristic distance between threading dislocations 44. A characteristic distance, d, between dislocations, which can be an upper bound of the characteristic size of the plurality of compositional inhomogeneous regions 42, can be characterized by:

$$d = \frac{1}{\sqrt{N}-1} \quad (1)$$

where N is the dislocation density. For example, if N=$10^9$ dislocations per cm$^2$, the characteristic distance, d, between the dislocations is $$d = \frac{1}{\sqrt{N}-1} \approx 3*10^{-5} \text{ cm} = 300 \text{ nm}.$$

Therefore, the lateral area of the compositional inhomogeneous regions 42 can be configured to be smaller than 90,000 nm$^2$. The lateral area of the regions 42 can be adjusted using any solution, e.g., by adjusting one or more conditions during epitaxial growth of the semiconductor (e.g., the quantum well 38).

The average distance between compositional inhomogeneous regions 42 can be on the order of or less than an am bipolar diffusion length L. The am bipolar diffusion length L is characterized by:

$$L=(D_a \tau)^{0.5} \quad (2)$$

wherein $D_a$ is the ambipolar diffusion coefficient and $\tau$ is the overall recombination time. For example, in an embodiment, $D_a$ for AlGaN is approximately 10 cm$^2$/s, so the diffusion length L can be on the order of 1 micron for $\tau$ at approximately one nanosecond.

The internal quantum efficiency (IQE) of a device also can depend on the density, average lateral size, as well as the depth of the compositional inhomogeneous regions. Furthermore, the IQE can depend on the Auger recombination at high injection levels. For example, consider compositional inhomogeneous regions of a small size having a certain density throughout the semiconductor layer, which is small enough for the compositional inhomogeneous regions to have substantially no overlap. In this case, an expected concentration of carriers at such localization centers will be higher than the average concentration, thereby leading to smaller radiation recombination times at such regions. This may increase the IQE under conditions so that a considerable fraction of the carriers are captured by the compositional inhomogeneous regions for radiative recombination. In an embodiment, a characteristic size of the compositional inhomogeneous regions is smaller than $1/N_{reg}^{0.5}$, where $N_{reg}$ is the average density of the compositional inhomogeneous regions per unit area.

The area and the density of the compositional inhomogeneous regions 42 also can affect a reliability and/or performance of a device. For example, radiation can lead to radiation-enhanced dislocation glide (REDG). REDG is characterized by a reduction of activation energy for glide velocity. The REDG shares features common with similar effects in point defects known as the recombination-enhanced defect reaction (REDR). To improve reliability of a device, the radiation and recombination process can be configured to occur away from threading dislocation cores in order to reduce radiation-enhanced dislocation glide. For example, for a case of compositional inhomogeneous regions 42 having a small characteristic lateral area (e.g., as defined herein) and low density (e.g., much smaller than the dislocation density), radiation emitted in those regions may be spatially isolated from the threading dislocation cores 44 as long as the compositional inhomogeneous regions 42 are located between the threading dislocation core regions. This can result in improved reliability of the device.

Turning now to FIGS. 6A and 6B, in an embodiment, the plurality of compositional inhomogeneous regions 42 can be located along a plane located proximate to (e.g., at or within a few atomic layers of) an interface 46 between a quantum well 38 and a barrier 40. In this embodiment, the compositional inhomogeneous regions 42 can be configured to capture carriers for radiative recombination. To this extent, the regions 42 can have a depth of at least thermal energy. In a more specific embodiment, the compositional inhomogeneous regions 42 have an energy depth of at least one optical phonon energy.

In an embodiment, the semiconductor layers of the device 10 (FIG. 2) can comprise an $Al_xB_yIn_zGa_{1-x-y-z}N$ alloy with $0 \leq x \leq 1$, $0 \leq y \leq 1$, $0 \leq z \leq 1$, $0 \leq 1-x-y-z \leq 1$. Semiconductor heterostructures formed of $Al_xB_yIn_zGa_{1-x-y-z}N$ alloys contain polarization fields due to spontaneous polarization and piezopolarization. This results in the tilting and bending of the band diagram, as shown, for example, in FIG. 7A. In a particular embodiment, the active region 18 can include a heterostructure (e.g., a multiple quantum well structure) of barriers and quantum wells. An energy on one side of a conductive band for the quantum wells can be higher than the energy on the other side (e.g., a tilted conductive band). Similarly, the valence band is called a "tilted" valence band. This tilting of the conductive band results in electron localization in the region with lower energy, i.e., the low side of the band diagram. In a more specific embodiment, the compositional inhomogeneous regions 42 can be located along a plane 48 located proximate to the low side of the conductive band of a quantum well 38. In another embodiment, compositional inhomogeneous regions 42 with greater depth can be located along a plane proximate to the high side of the conductive band of the quantum well 38, e.g., to promote tunneling of the electron wave function from the low side to the high side. This can result in a better spread of the electron wave function, improved overlap with holes, and/or the like.

In an embodiment shown in FIG. 8A, a semiconductor layer can include both large and small scale compositional inhomogeneous regions (which can be achieved, for example, by varying conditions of the epitaxial growth). The large scale compositional inhomogeneous regions 42A can have large lateral areas of inhomogeneous regions. For example, the lateral area for the large scale compositional inhomogeneous regions 42A can be configured to be larger than the square of the characteristic distance between the threading dislocations 44 (which can be achieved, for example, by varying conditions of the epitaxial growth). An energy depth of the large scale compositional inhomogeneous regions 42A can be on the order of one thermal energy or more. The large scale compositional inhomogeneous regions 42A can allow for an efficient capture of the carriers, relative localization of the carriers within the large energy valleys (e.g., 42A in the band gap map of FIG. 8B), and/or the like. Subsequent localization of carriers can be due to capture at the small scale compositional inhomogeneous regions 42B. The small scale compositional inhomogeneous regions 42B also can have a depth on the order of one thermal energy or more. The small scale compositional inhomogeneous regions 42B have a lateral area that is smaller than the square of the characteristic distance between the threading dislocations 44. The small scale compositional inhomogeneous regions 42B allow for capturing the carriers before the carriers are captured by the threading dislocations 44.

In another embodiment shown in FIGS. 9A and 9B, a distribution of the compositional inhomogeneous regions 42 can be graded. For example, a depth of the energy level across a quantum well 38 can increase or decrease from an area proximate to a first barrier 40 to an area proximate to a second barrier (not shown). In FIG. 9A, the distribution of the compositional inhomogeneous regions 42 is graded such that the energy depth decreases towards the first barrier 40. In FIG. 9B, the distribution of the compositional inhomogeneous regions 42 is graded such that the energy depth increases toward the first barrier 40.

Figure 10B:
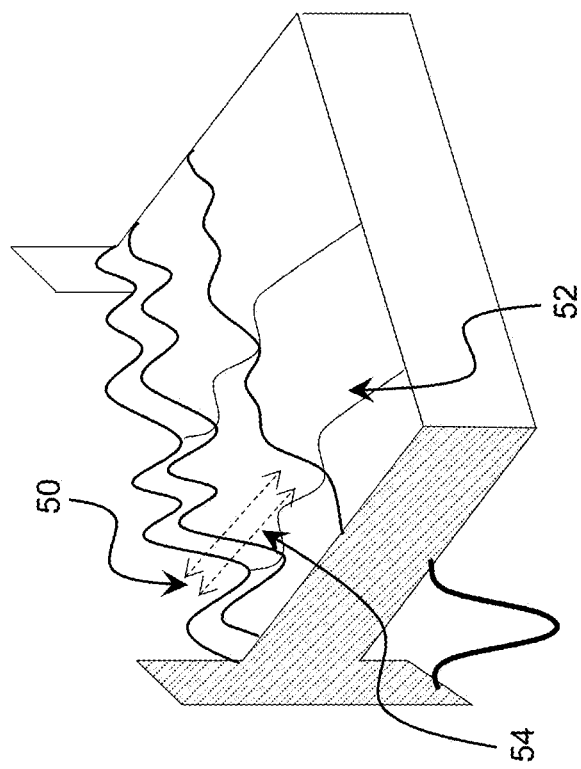
FIGS. 10A and 10B show hybrid structure/band diagrams of portions of an illustrative multiple quantum well structure according to an embodiment.
Figure 10A:
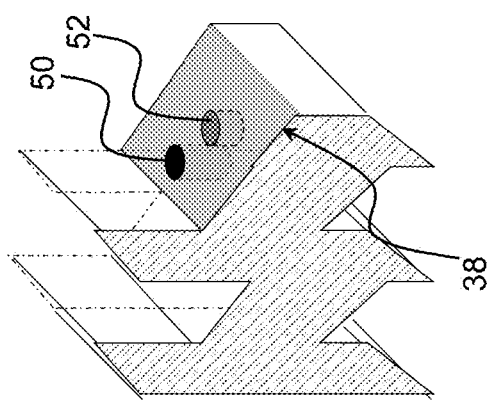

For quantum wells with tilted conduction bands, such as the quantum wells 38 shown in FIG. 7A, distributed grading of the compositional inhomogeneous regions 42 can promote tunneling of carriers to the regions having higher band gaps. For example, in FIG. 10A, a quantum well 38 is shown including a first localization region 50 and a second localization region 52. The first localization region 50 can have a deeper energy band gap level than the second localization region 52, e.g., for tunneling to occur between the regions 50, 52. This tunneling effect can improve an overlap of the electron/hole wave function and promote higher recombination rates. The black curved line included at the bottom of the quantum well 38 in FIG. 10B corresponds to an electron wave function, which has a concentration in the corresponding portion of the quantum well 38.

Figure 11:
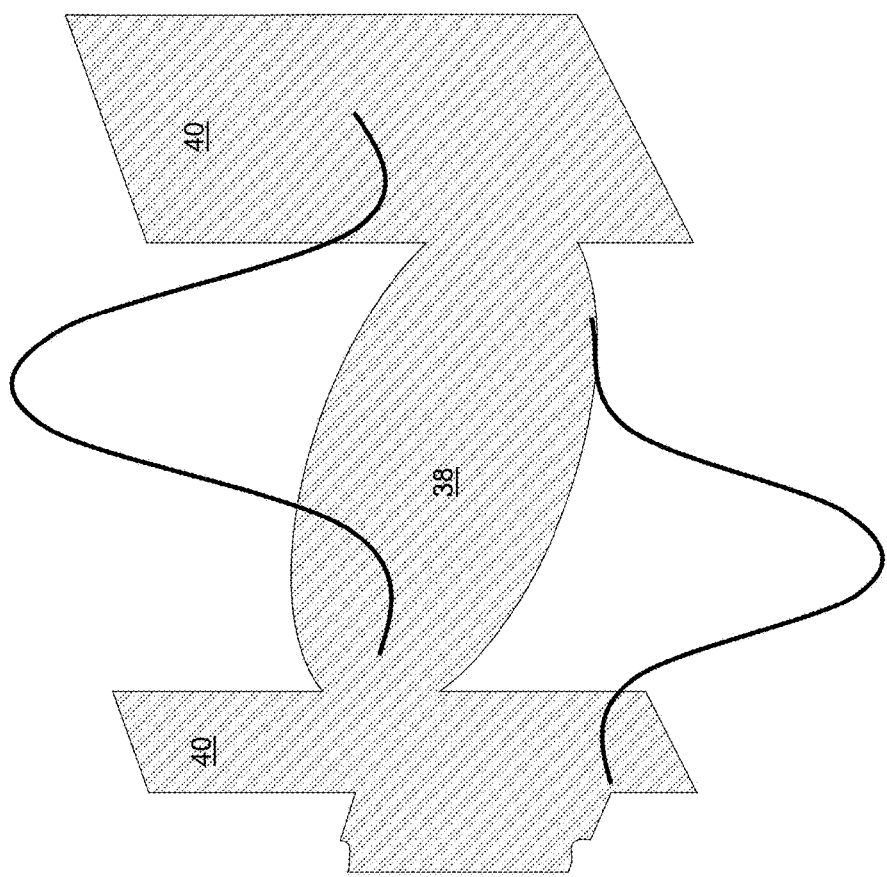
FIG. 11 shows a band diagram of an illustrative quantum well according to embodiment.

Turning now to FIG. 11, a graded distribution of compositional inhomogeneous regions can be combined or enhanced with compositional grading of a quantum well 38. For example, the quantum well 38 can have graded composition that results in band bending at the first and/or second side of the quantum well 38. When the first side of the quantum well 38 is a high side and contains deeper compositional inhomogeneous regions than the second side, the tunneling of carriers can be promoted by further reducing the energy of the conducting band at the first side through compositional grading. Illustrative distributions of electron (top) and hole (bottom) wave functions are shown by the curved lines.

Figure 12B:
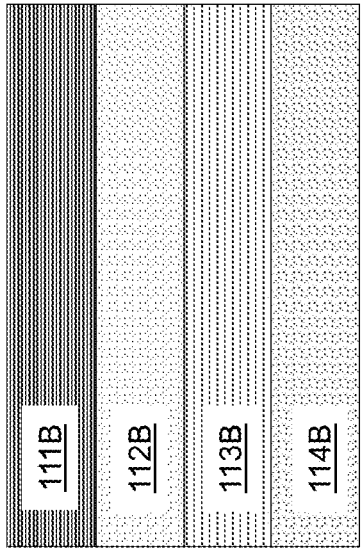
FIGS. 12A-12C show illustrative heterostructures according to embodiments.

In an embodiment, multiple semiconductor layers in a device 10 (FIG. 2) can include compositional inhomogeneous regions. For example, turning to FIGS. 12A-12C, layers that include compositional inhomogeneous regions can, in addition to improving carrier localization for radiative recombination, affect the stress and strain in the device 10. Controlling the stress and strain within the device 10 can control the propagation of threading dislocations throughout the layers of the device 10. For example, with semiconductor layers including group III materials, if the compositional difference between the layers is at least five percent in at least one molar fraction (e.g., x, y, z), the layers with the compositional inhomogeneous regions can enhance or reduce compressive and tensile stresses in the semiconductor layers.

Figure 12A:
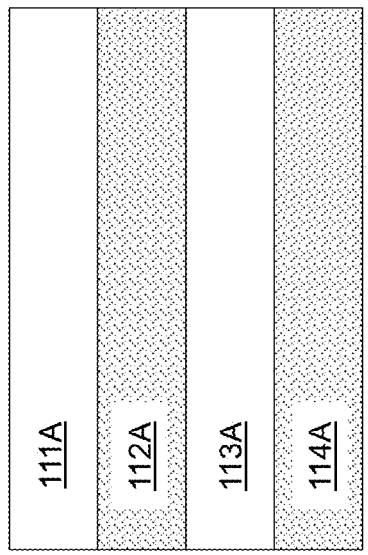
Figure 12C:
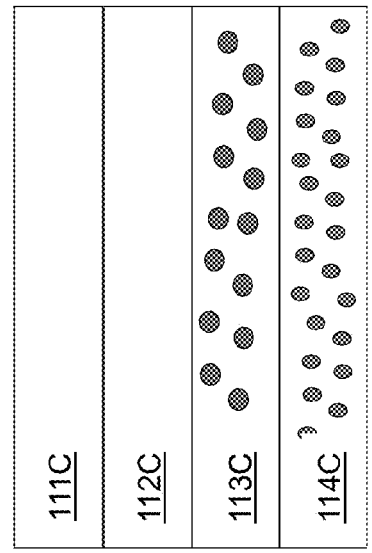

Controlling the stress and strain within the device 10 also can affect the three dimensional growth of layers epitaxially grown above the layers with compositional inhomogeneous regions. For example, compressive strain promotes three dimensional island formation, while tensile strain promotes layer-by-layer two dimensional crystal formation. The type and magnitude of the strain can be used to control the compositional inhomogeneous regions. For example, adjacent layers with compositional inhomogeneous regions that differ by at least a few percent in average band gap fluctuation amplitude, density, lateral size, and/or the like, can be grown. FIG. 12C shows a layer 113C, which includes compositional inhomogeneous regions that differ from the compositional inhomogeneous regions in layer 114C.

Although the embodiments shown in the figures include compositional inhomogeneous regions in the quantum well, it is understood that the compositional inhomogeneous regions can be included in any layer. For example, the barrier 40 (FIG. 3A) can include a plurality of compositional inhomogeneous regions, e.g., for stress/strain control. The plurality of compositional inhomogeneous regions in the barrier 40 can control the stress/strain without altering the average band gap characteristic of the barrier 40. For example, in FIG. 12B, the layer 114B includes a plurality of compositional inhomogeneous regions and is adjacent to a layer 113B grown at a high V/III ratio. The layer 112B includes a plurality of compositional inhomogeneous regions and is adjacent to the layer 111B that is grown at a low V/III ratio. In a more particular embodiment, FIG. 12B can be a multi-layer barrier comprising a AlGaN/AlGaN superlattice to control the compressive strain in the quantum wells and also affect the compositional inhomogeneous regions in the quantum wells, which can be misplaced relative to each other in different superlattice layers.

In another embodiment, a superlattice of semiconductor layers can include layers with relatively uniform composition alternating with layers with compositional inhomogeneous regions. In FIG. 12A, layers 111A and 113A have relatively uniform composition, while layers 112A and 114A include compositional inhomogeneous regions. Relatively uniform composition includes compositional variation of less than three thermal energies across the layer. In another embodiment, a layer in the superlattice of semiconductor layers can vary from an adjacent layer by more than five percent in band gap amplitude, density, and/or the like for the compositional inhomogeneous regions. Regardless, at least two layers in the superlattice of semiconductor layers can be substantially equal (e.g., within a few (e.g., three) percent) in at least one of: a distribution grading, a band gap magnitude, a density, and/or the like of the plurality of compositional inhomogeneous regions.

In another embodiment, variations in band gap can be achieved by localized doping. Turning to FIG. 13A, localized p-doping at a region 56, which can be located anywhere within the semiconductor layer (e.g., a quantum well), induces localized energy maxima for electrons 58 and localized energy minimum for holes 60. In an embodiment, the localized p-doping inhomogeneities include a characteristic size less than the electron Bohr radius. With the p-doping inhomogeneities, the electrons 58 can tunnel through the energy maxima and recombine with holes 60 localized at the hole energy minima. In a more specific embodiment, the p-doping can be located within the valleys of the compositional inhomogeneous regions. For example, in FIG. 13B, the large scale compositional inhomogeneous region 42A can contain the localized doping inhomogeneities 56 within the valley of the small scale compositional inhomogeneous region 42B. The valley of the small scale compositional inhomogeneous region 42B can be defined as the region with the conduction energy value that is less than the average conduction band energy level. The p-doping inhomogeneities 56 can promote further carrier localization and carrier recombination. The localized p-doping can be an impurity, such as silicon, magnesium, beryllium, germanium, carbon, and/or the like.

Control over energy depth, distribution grading, lateral area size, and/or the like, of the compositional inhomogeneous regions can be achieved by controlling the epitaxial growth parameters during metal organic chemical vapor deposition (MOCVD) growth. Alloy fluctuations can be induced by fundamental difference in the mobility of the particular metal (Al, Ga, In, etc.) adatoms on the surface at particular growth conditions. Therefore, compositional inhomogeneous regions can be regulated by controlling parameters which influence the mobility of the adatoms, such as growth temperature, V/III ratio, growth rate, and layer-strain. Growth temperature in the range of 600-1300° C., V/III ratio in the range of 10-50000, growth rate in the range of 1-200 nm/min, and/or the like, can be used to create compositional inhomogeneous regions. For example, in a specific embodiment, compositional inhomogeneous regions in $Al_{0.5}Ga_{0.5}N$ can be enhanced by reducing growth temperature (e.g., less than 1200° C.) and increasing V/III ratio (e.g., greater than one hundred) at faster growth rates (e.g., greater than five nanometers/minute). Regardless, the semiconductor layer including the compositional inhomogeneous regions can be epitaxially grown partially or completely pseudomorphically (e.g., with the same lattice constant as the substrate) over another layer or substrate. Partially pseudomorphic is defined as epitaxial growth with less than 95% degree of relaxation.

Figure 14B:
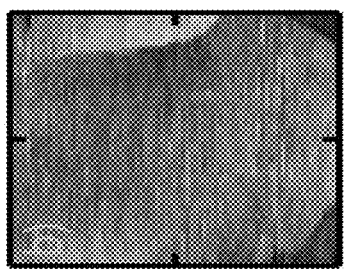
FIGS. 14A-14C show illustrative topographical images corresponding to sample AlGaN layers with increasing Al molar fractions.
Figure 14A:
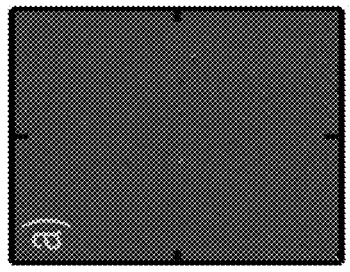
Figure 14C:
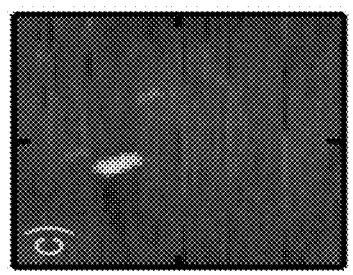

Turning now to FIGS. 14A-14C, illustrative topographic images corresponding to sample AlGaN layers with increasing Al molar fractions are shown. The surface morphology image indicates the presence of defects and inhomogeneous regions in the material. In FIGS. 14A and 14B, the molar fraction of Al is increased from 0.3 to 0.42. FIG. 14B clearly illustrates that the surface of the material has more pronounced features for the higher Al molar fraction. In FIG. 14C, the molar fraction of Al is increased to 0.5 and the defects and inhomogeneous regions are readily apparent. In a specific embodiment of the device, the active region can contain an AlN molar fraction of between approximately twenty and approximately eighty percent.

Analysis of compositional inhomogeneous regions in a semiconductor layer can be performed using scanning near field optical microscopy (SNOM), which provides sub-wavelength spatial resolution. Electroluminescence and photoluminescence (PL) SNOM studies of c-plane AlGaN quantum wells (QWs) have identified carrier localization and non-radiative recombination centers. Furthermore, these studies reveal potential barriers around the extended defects. Near-field maps of the PL peak intensity, and peak energy, are presented for $Al_{0.3}Ga_{0.7}N$, $Al_{0.42}Ga_{0.58}N$, and $Al_{0.5}Ga_{0.5}N$ layers in FIGS. 15A, 15C, and 15C, respectively. Comparing the intensity of emission with peak energy map illustrates that the alloys containing low-to-modest molar ratios of aluminum, such as a molar fraction of 0.3 or 0.42, have domain-like areas emitting at red shifted wavelengths. As the aluminum content is increased, domain-like structures give way to smaller compositional inhomogeneous regions distributed uniformly throughout the structure. These compositional inhomogeneous regions have a red shifted emission.

Figure 15A:
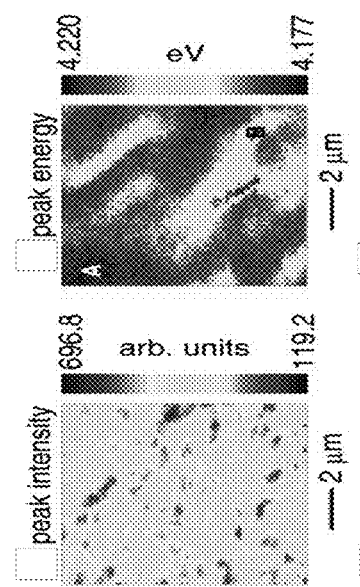
FIGS. 15A-15C show illustrative maps corresponding to sample AlGaN layers with increasing Al molar fractions.
Figure 15B:
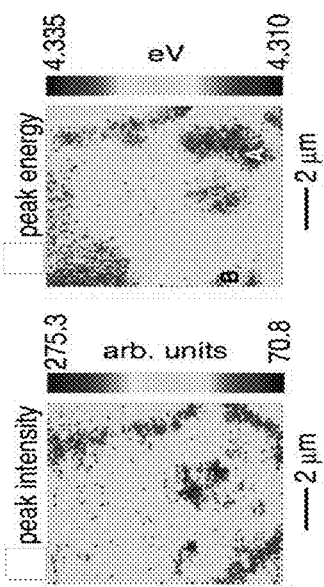
Figure 15C:
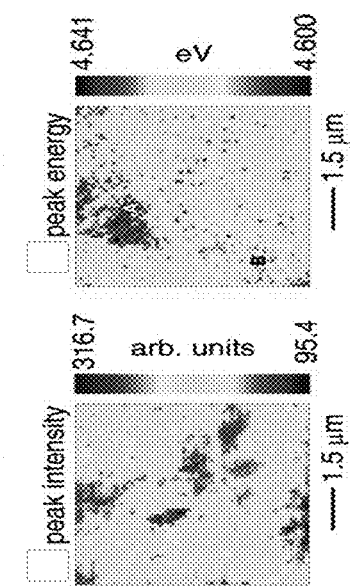

Additionally, in FIGS. 15A and 15B, a correlation between the intensity peak and the energy peak is shown. In particular, the red shifted regions radiate at somewhat smaller intensity than blue shifted counterparts. This is consistent with growth models, where during the initial growth stage, adjacent small islands, from which the growth starts, coalesce into larger grains. As the islands enlarge, Ga adatoms, having a larger lateral mobility than Al adatoms, reach the island boundaries more rapidly. Therefore, it is expected that the Ga concentration in the coalescence be higher than in the center of the islands. At the same time, the coalescent boundaries contain large numbers of defects. It is reasonable to expect lower emission intensity in these areas.

Figure 16A:
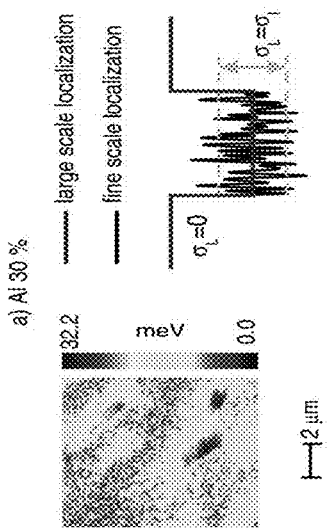
FIGS. 16A-16C show illustrative maps corresponding to sample AlGaN layers with increasing Al molar fractions.
Figure 16B:
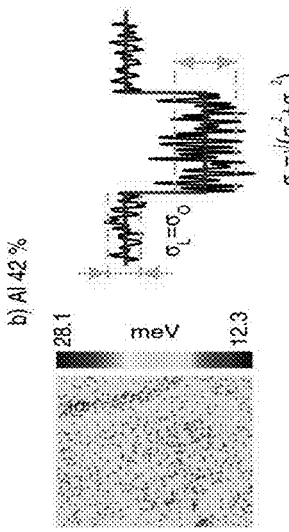
Figure 16C:
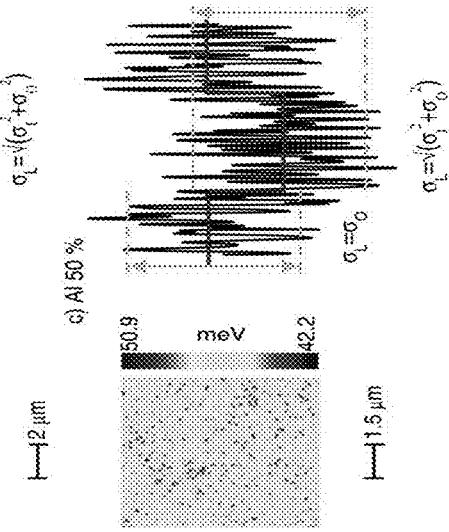

Turning now to FIGS. 16A-16C, illustrative maps corresponding to sample AlGaN layers with increasing Al molar fractions are shown. The band gap illustrates how increasing the Al molar fraction increases the amplitude of the band gap for the small scale compositional inhomogeneous regions to be similar to the amplitude of the large scale compositional inhomogeneous regions.

FIG. 17 shows a portion of a layer according to an embodiment of the invention. The layer can include a plurality of domains 60 and the compositional inhomogeneous regions can be grown to be away from the domain boundaries 62, where a large concentration of threading dislocations and defects are located. The semiconductor layer can be grown using Migration Enhanced Metalorganic Chemical Vapor Deposition (MEMOCVD), which has a higher growth rate than Molecular Beam Epitaxy (MBE). The exact growth rate of the MEMOCVD can be selected to control the diffusion length, $d_i$, of the Ga atoms, such that the diffusion length is smaller than the average length, L, between threading dislocations.

The average length, L, between threading dislocation cores is determined by the density of the threading dislocations in the semiconductor layer. In an embodiment, a method of growth takes advantage of an approach disclosed in U.S. Patent Application Publication No. 2014/0110754, which is hereby incorporated by reference. The methods of growth disclose the art of epitaxial growth of semiconductor layers with low dislocation density due to growth of alternating compressive and tensile layers. FIGS. 18A and 18B show possible embodiments of the method, where in FIG. 18A, the buffer layer is grown on a substrate with compressive layer following the buffer layer alternating with tensile layer for several periods of epitaxial growth. FIG. 18B shows another embodiment of the method in which the tensile layer is grown on the buffer layer with subsequent compressive layer grown above the tensile layer. It is understood that the buffer layer is optional and may not be needed for some embodiments.

Figure 19B:
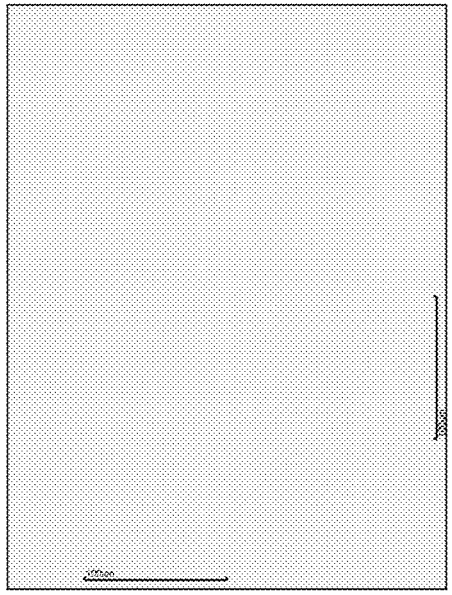
FIGS. 19A and 19B show illustrative bright field optical microscope images of layers according to an embodiment.
Figure 19A:
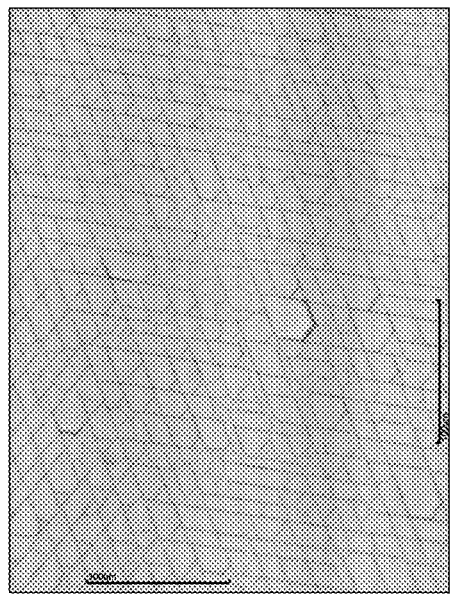
Figure 20:
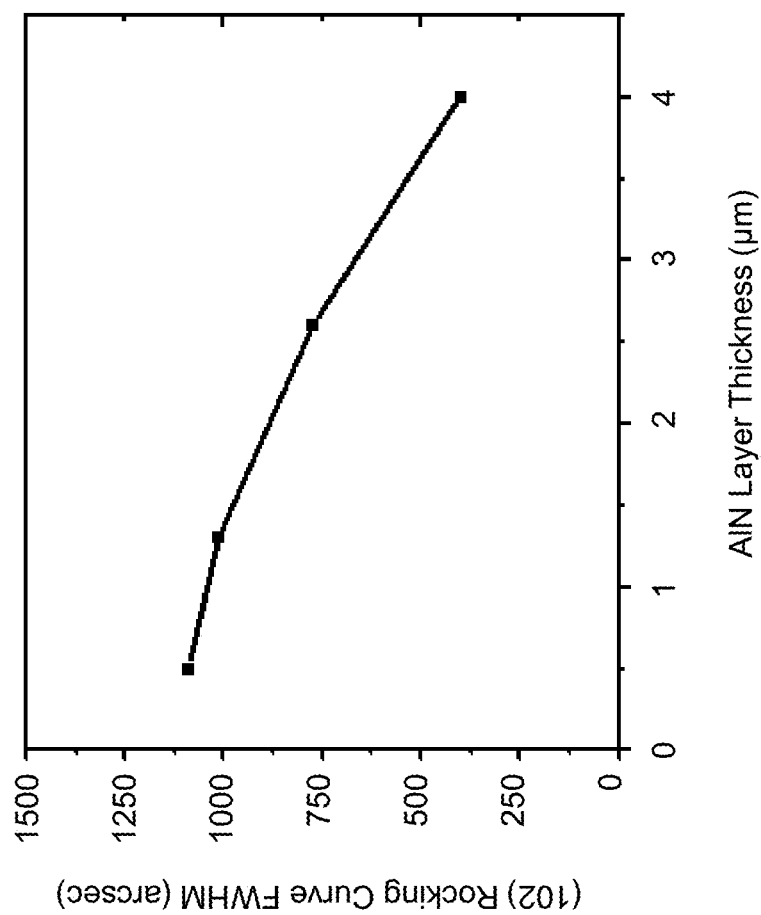
FIG. 20 shows a graph showing the reduction of the full width at half maximum (FWHM) as a function of increasing the AlN layer thickness according to an embodiment.

The advantages of this method are shown in FIGS. 19A and 19B, which illustrate the bright field optical microscope image of a layer grown without any strain modulation (FIG. 19A) and a layer with strain modulation (FIG. 19B). As clearly seen from the figures, the number of cracks (e.g., threading dislocations) is significantly reduced using the present methods. Other methods of analyzing dislocation density include analysis of a rocking curve full width at half maximum (FWHM) shown in FIG. 20. Reduction in AlN (102) XRD rocking curve FWHM, shown in FIG. 20, as a function of layer thickness indicates reduced edge dislocations density.

Figure 21A:
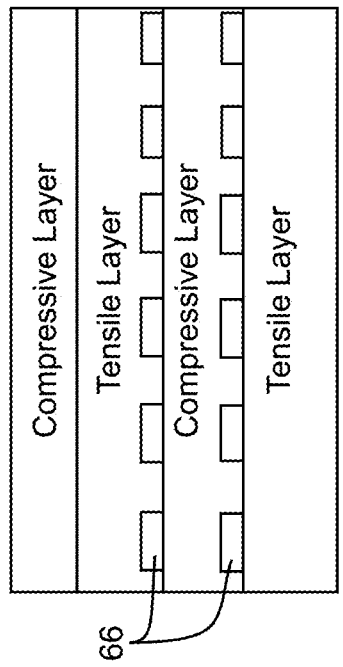
FIGS. 21A and 21B show illustrative patterning for compressive and tensile layers in a device according to an embodiment.
Figure 21B:
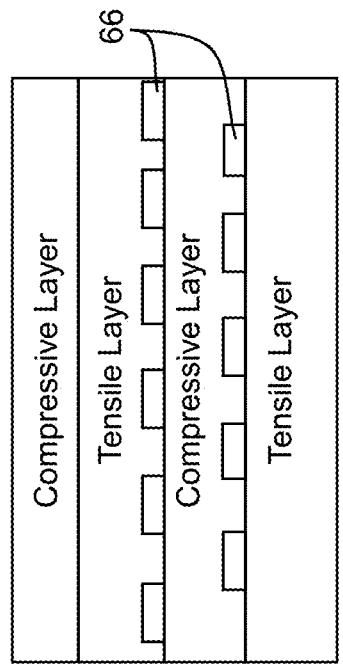

U.S. Patent Application Publication No. 2014/0110754 also provides that dislocation reduction may be obtained by reducing build up stress in semiconductor layers by patterning the substrate, the buffer layer, and/or one or more of the semiconductor layers. FIGS. 21A and 21B show that patterning of a substrate and/or intermediate semiconductor layers can be employed to produce compressed and tensile layers having a common boundary not only in vertical direction of growth, but also, in lateral layer direction. Possible patterns comprise stripes, rectangular windows 66, and/or the like. Also, the relative position of patterning elements between sets of layers may be varied. For example, in one embodiment, the position of patterning elements on one layer may form a checkerboard-like formation with the patterning elements on another layer (FIG. 21A). Alternatively, in an embodiment, the position of patterning element on one layer may be the same lateral location as the patterning elements on another layer (FIG. 21B).

Figure 22:
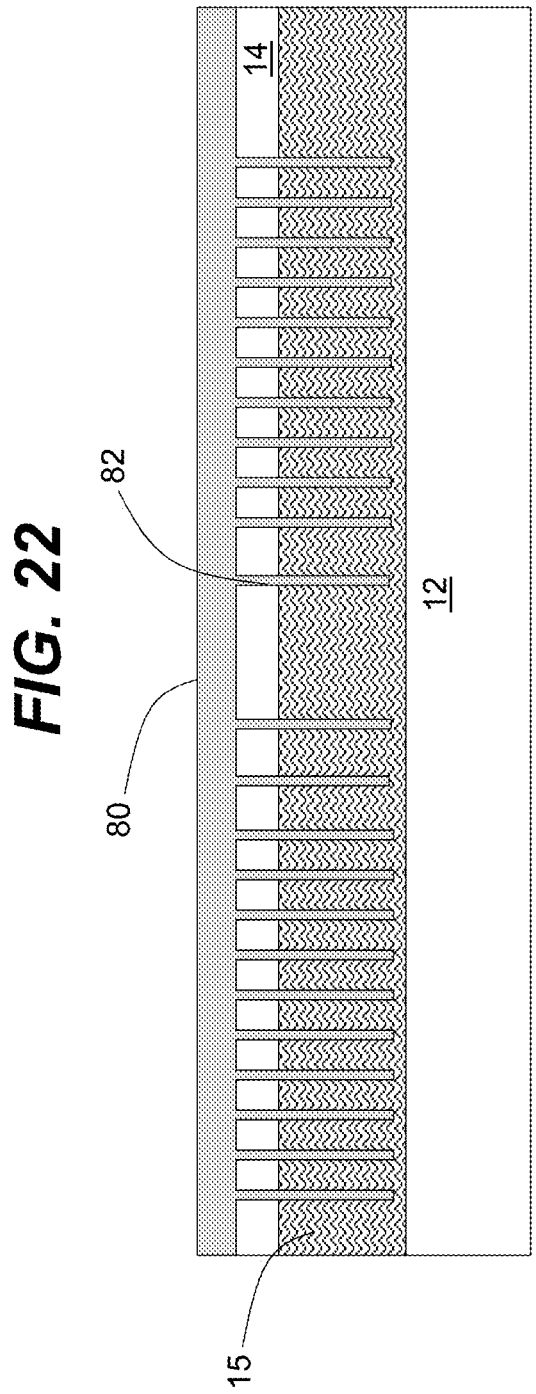
FIG. 22 shows an illustrative contact to a layer including compositional inhomogeneities according to an embodiment.

In an embodiment, a contact can be formed for a semiconductor layer including a plurality of compositional inhomogeneous regions. For example, FIG. 22 shows a contact 80 for a semiconductor layer 15 including a plurality of compositional inhomogeneous regions (not shown) according to an embodiment. The semiconductor layer 15 is located between the substrate 12 and a buffer layer 14 and can include any embodiment of compositional inhomogeneous regions discussed herein. A plurality of metallic protrusions 82 extend from the contact 80 through the buffer layer 14 in order to contact the semiconductor layer 15.

The plurality of metallic protrusions 82 can be formed using any solution. For example, the plurality of metallic protrusions 82 can be formed by etching the buffer layer 14 and at least a portion of the semiconductor layer 15 prior to the deposition of the metallic protrusions 82 and the contact 80. In another example, selective overgrowth can be used when growing the semiconductor layer 15 and the buffer layer 14 prior to the deposition of the metallic protrusions 82 and the contact 80. The metallic protrusions 82 and the contact 80 can be deposited through evaporation or a sputtering technique followed by a subsequent annealing. Alternatively, instead of the etching or selective overgrowth technique, the buffer layer 14 and the semiconductor layer 15 can be grown to contain a plurality of voids or pores for the plurality of metallic protrusions 82. A porous semiconductor layer including a plurality of voids can be formed by utilizing 3-dimensional (3D) growth techniques for semiconductor layers. The buffer layer 14 can comprise a high adhesion to the metallic contact 80 and the semiconductor layer 15 can be a highly conductive layer. In an embodiment, the buffer layer 14 can have a higher aluminum nitride molar fraction than the average aluminum nitride molar fraction of the semiconductor layer 15. In an embodiment, the semiconductor layer 15 can be a thin layer with a thickness of approximately 10 nanometers (nm) to approximately 300 nm. In an embodiment, the thickness of the semiconductor layer 15 is comparable to the length of the plurality of metallic protrusions 82. The buffer layer 14 can be partially transparent to radiation (e.g., at least 30% of the radiation is transmitted through the buffer layer 14) when the radiation is normal to the surface of the layer 14.

Figure 23A:
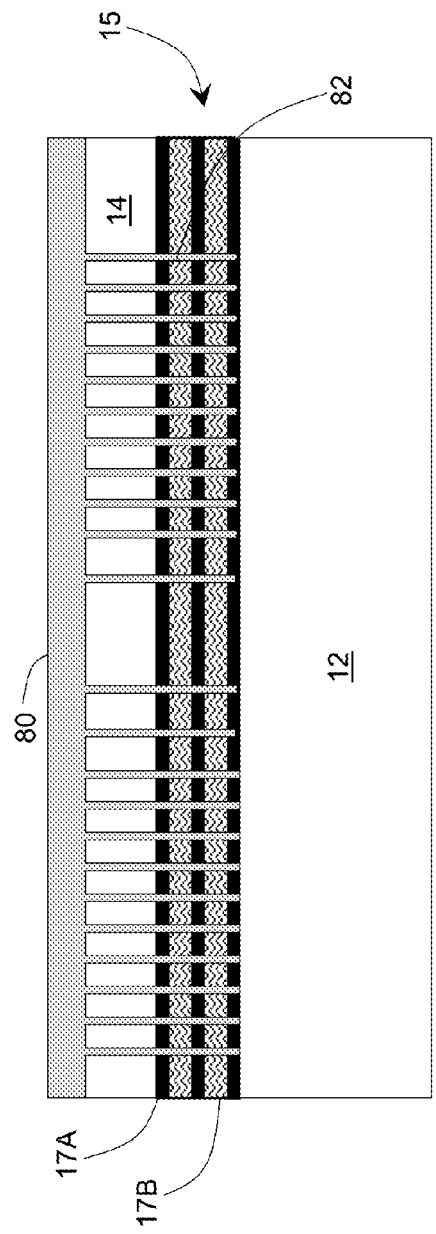
FIGS. 23A and 23B show an illustrative contact to a layer including compositional inhomogeneities and compositional variations according to an embodiment.
Figure 23B:
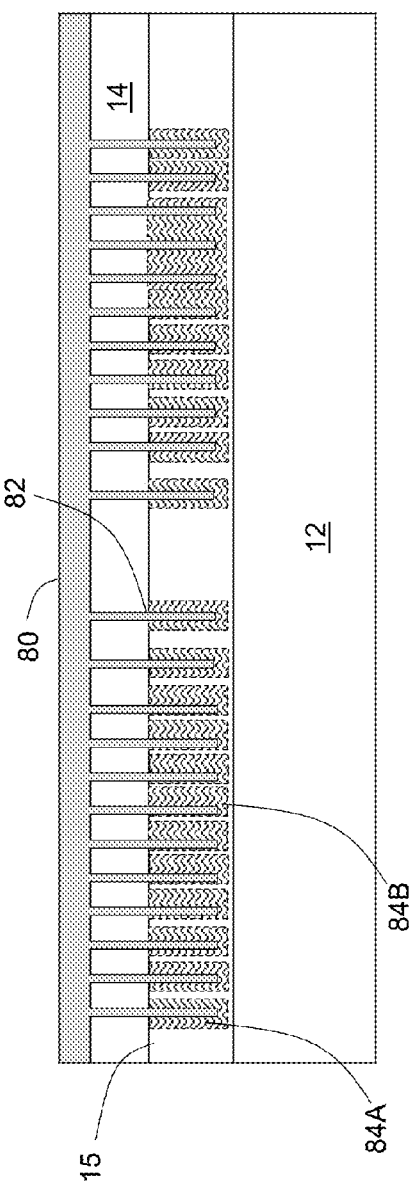

Turning now to FIGS. 23A and 23B, a contact for a semiconductor layer including a plurality of compositional inhomogeneous regions according to embodiments is shown. In FIG. 23A, the semiconductor layer 15 can include a set of alternating sublayers (e.g., a first sublayer 17A and a second sub layer 17B). Although only four sublayers are shown, it is understood that any number of sublayers can be included. Further, although only two types of sublayers are shown, it is understood that any number of types of sublayers can be included. In an embodiment, an average bandgap for the first sublayer 17A is different than the average bandgap of the second sublayer 17B. For example, the first sublayers 17A can comprise quantum well structures including a plurality of compositional inhomogeneous regions 42 (FIG. 3A), while the second sublayers 17B can comprise barrier structures (having a wider bandgap than quantum wells) including a plurality of compositional inhomogeneous regions 42. In another embodiment, the variance of the bandgap for the first sublayer 17A can be different than the variance of the bandgap for the second sublayer 17B. The variance refers to the degree of variation of the bandgap within a layer. For example, a bandgap variation of 100 meV refers to a layer with fluctuations in the bandgap on the order of 100 meV.

In an embodiment, the inhomogeneous regions in the second sublayer 17B can form a sufficiently dense structure to allow percolation. For example, the structure of the second sublayer 17B (e.g., barrier) can comprise an $Al_xGa_{1-x}N$ layer with a varying molar fraction x. The variation in the molar fraction x allows for variation in the bandgap energies within the second sublayer 17B. That is, some regions within the second sublayer 17B can have higher bandgap energies, while other regions can have lower bandgap energies. The regions in the second sublayer 17B with the lower bandgap energies have a sufficient density so that there is an overlap of such regions or close proximity of such regions, which leads to an interconnected (or percolated) low bandgap structure. Such a structure can promote conductivity of the barrier layer 14. It is understood that the embodiment shown in FIG. 22 can also support a percolated low bandgap structure in the semiconductor layer 15. It is also understood that the first sublayer 17A can contain structures that allow percolation.

A 2-dimensional (2D) gas is formed at the interface of a quantum well/barrier (e.g., the interface between the first sublayer 17A and the second sublayer 17B). The formation of a 2D gas is particularly important for semiconductors which have a large degree of polarization, such as group III nitrides (e.g., AlGaN, and/or the like). The regions forming the 2D gas are contacted by the plurality of metallic protrusions 82. Due to the inhomogeneous regions at the interface of the quantum well and barrier (e.g., the first sublayer 17A and the second sublayer 17B), the 2D gas can have a diffusive profile and can partially penetrate through the second sublayer 17B (e.g., barriers) in the regions with low bandgap energies. The conductivity of the contact 80 can be improved by the plurality of metallic protrusions 82 penetrating the second sublayer 17B (e.g., barriers). In order to have a sufficient conductivity, each of the plurality of metal protrusions 82 are located at a distance away from each other that does not exceed the current spreading length in the semiconductor layer 15.

Turning to FIG. 23B, a contact for a semiconductor layer including a plurality of inhomogeneous regions according to an embodiment is shown. In this embodiment, the semiconductor layer 15 can include a plurality of domains 84A, 84B that have compositional inhomogeneous regions. The plurality of domains 84A, 84B can form any structure, including larger domains that have several protrusions embedded into them, or smaller domains. The plurality of domains 84A, 84B can have a lateral dimensions ranging from 1 nanometer (nm) to several microns. A plurality of metallic protrusions 82 from a contact 80 extend into each of the domains 84A, 84B. In an embodiment, each domain 84A, 84B can include a lower aluminum nitride molar fraction as compared to the average molar fraction of aluminum within the semiconductor layer 15 and result in regions having higher conductivity. The domains 84A, 84B can be formed using any solution, such as, for example, by depositing a material into an etched valley in the semiconductor layer 15.

A plurality of compositional inhomogeneous regions in a semiconductor layer including compositional inhomogeneous regions can increase the diffusion of a metallic contact through the semiconductor layer during the process of annealing, depending on the semiconductor's characteristics. For example, in FIG. 24, an illustrative contact 180 to a semiconductor layer 15 including a plurality of compositional inhomogeneous regions according to an embodiment is shown. The semiconductor layer 15 can include a graded composition with an amplitude that varies throughout the layer. In an embodiment, the annealing of the contact 180 can depend on the composition of the semiconductor layer 15. For example, the annealing of the contact 180 can depend on the lattice quality of the semiconductor layer 15. In an embodiment, the lattice containing a large number of dislocations and inhomogeneous regions can promote a deep penetration of the contact 180 into the semiconductor layer 15 (via metallic protrusion 182). This can increase the diffusion area of the metal of the contact 180 into the semiconductor layer 15. Therefore, a semiconductor layer 15 including a graded composition allows for additional control during the process of contact annealing. For example, a layer with compositional inhomogeneous regions can be grown using three dimensional growth and allow for improved diffusion of the metallic contact 180 into the semiconductor layer 15, which provides improved metal penetration into the semiconductor layer 15, and as a result, improved ohmic properties of the contact 180. Additionally, the semiconductor layer 15 can provide improved alloying (e.g., mixing) of the metallic regions within the semiconductor layer 15. In an embodiment, the degree of mixing can be controlled by the degree of compositional inhomogeneous regions within the semiconductor layer 15. Each metallic protrusion 182 can be characterized by a diffusion distance $D_A$, which is generally indicative of the distance that the metallic elements associated with the metallic protrusion 182 diffuses within the semiconductor layer 15. Each semiconductor layer has a mobility and overall quality that determines the spread or diffusion of carriers and is characterized by a carrier diffusion length $D_I$. In an embodiment, the distance between adjacent protruding metallic protrusions 182 is selected to be comparable to a carrier diffusion length $D_I$. Another length scale present in the design is a diffusion distance $D_A$. The density of metallic protrusions 182 can be estimated based on these two length scales as follows: $N=1/(\pi(D_A+D_I)^2)$, where N is the number of metallic protrusions per unit area. In an embodiment, the length scale $D_I$ can be substituted by the current spreading length, which can be approximated as: $D_L=\sqrt{2D_A(rb)/atan(2rb/D_A)}$, where b is the semiconductor layer thickness, and $r=\rho_\perp/\rho_\parallel$, where $\rho_\parallel$ is a resistivity along the semiconductor layer direction and $\rho_\perp$ is a resistivity in the layer normal direction.

Figure 25A:
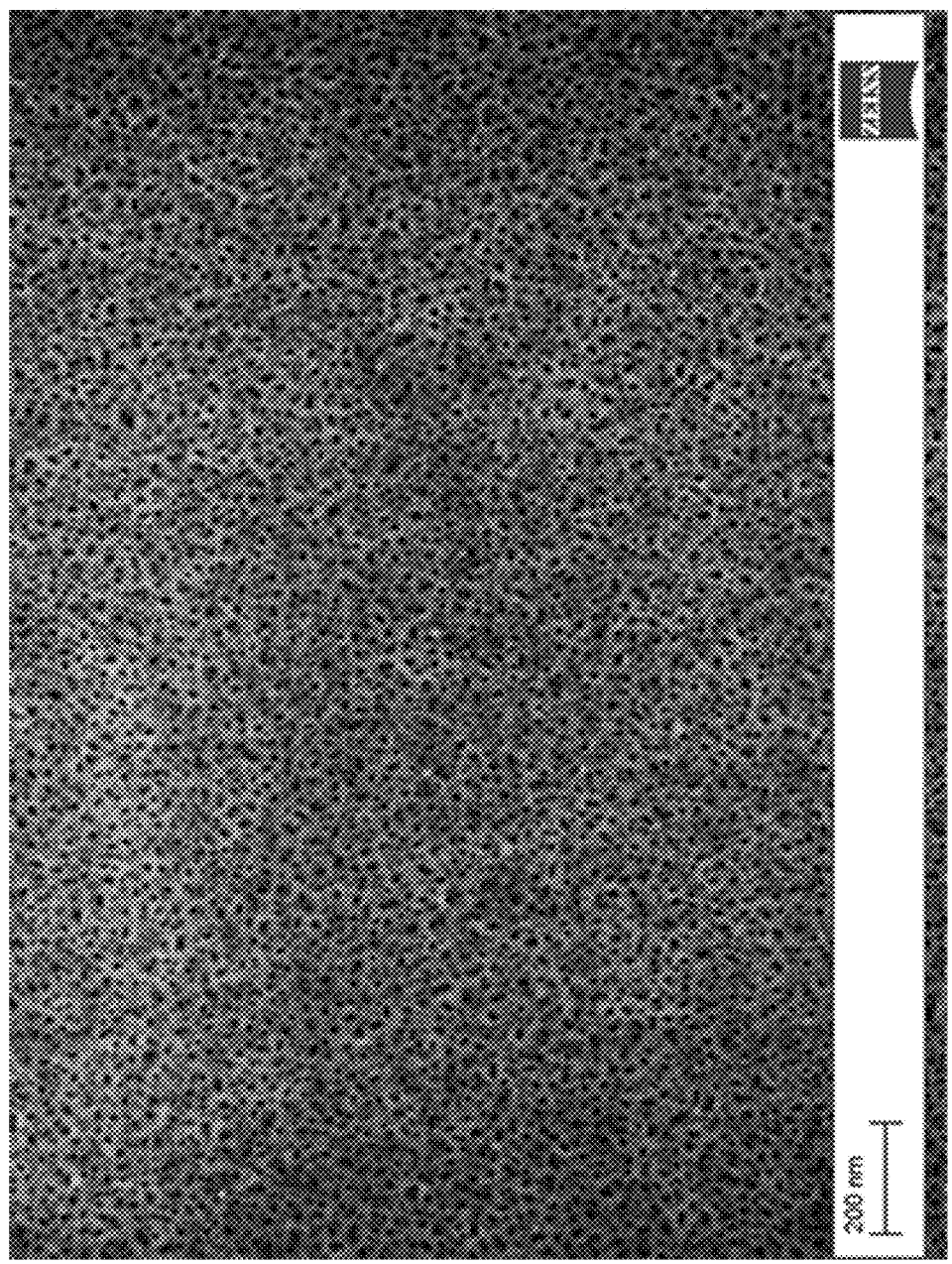
Figure 25B:
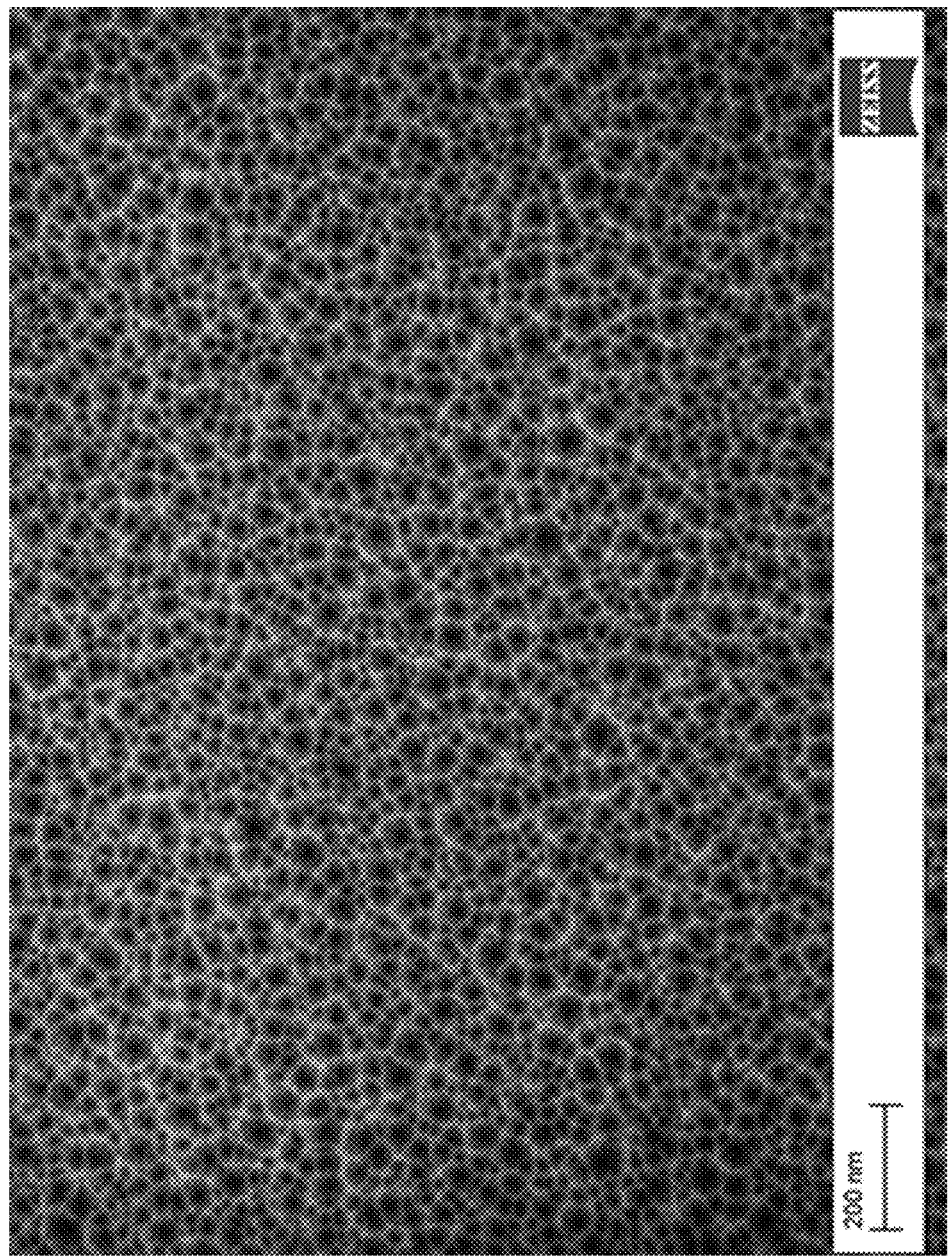

In an embodiment, etching the surfaces of a semiconductor layer can improve annealing of a contact to a semiconductor layer. Turning now to FIGS. 25A-25C, illustrative etched surfaces of a semiconductor layer according to embodiments are shown. FIG. 25C shows that a buffer layer 14 and/or a semiconductor layer 15 including a plurality of compositional inhomogeneous regions can be etched. As shown in FIG. 25A, in an embodiment, wet etching can be used. The parameters of the wet etching are selected to produce porous morphology on the scale of approximately 20 nanometers (nm). In another embodiment, as shown in FIG. 25B, larger pores can have a characteristic scale of approximately 40 nm to approximately 60 nm. In general, wet etching is selected to produce the optimal metallic contact after annealing. In an embodiment, optimal parameters for etching are selected in order to produce optimal optical properties of the metal-semiconductor interface (e.g., the interface between the contact 80 and the semiconductor layer 15 (FIG. 22)) for optical scattering. To select the optimal parameters, such as composition of the bath, temperature, presence of light, duration of etching, presence of catalyst, and/or the like, for etching, the scattering and contact characteristics can be evaluated and interpolated for several wet etching processes. In an embodiment, wet etching is selected to produce the porous morphology that is at least on the order of the target wavelength of the light emitting or light absorbing device.

In an embodiment, wet etching the semiconductor layer 15 results in a porous morphology that is correlated to the length scales of the compositional inhomogeneous regions within the semiconductor layer 15. During the wet etching process, regions with a higher aluminum molar fraction are etched more than domains with higher gallium nitride molar fractions. In an embodiment, the wet etching can be accompanied by electro-chemical etching, photo-chemical etching, or a combination. In a further embodiment, a photo-chemical etching can further control the length scales of the pores generated throughout the etching process.

In another embodiment, dry etching can also be used either independently of wet etching, or after the wet etching process. Dry etching can produce variations on the surface structure (of the barrier layer 14 surface and/or the semiconductor layer 15 surface) on the scale of approximately 0.5 micrometers to approximately 50 micrometers. In an embodiment, masking the area prior to etching can result in the formation of user determined patterns (e.g., a periodic structure). For example, such a structure can comprise a photonic crystal.

In an embodiment, non-uniform etching can be applied to a semiconductor layer including compositional inhomogeneous regions. Turning now to FIGS. 26A and 26B, illustrative etched surfaces of a semiconductor layer with non-uniform etching according to embodiments is shown. FIG. 26A shows that the etching can be different at the sides (e.g., along the width, along the perimeter, and/or the like) of the semiconductor layer 15 and the middle of the semiconductor layer 15. For example, a size and a depth of an etching domain 86A located at the side of the semiconductor layer 15 can be different than a size and a depth of an etching domain 86B located in the middle of the semiconductor layer 15. In an embodiment, as shown in FIG. 26B, the etching can vary both in an x direction and a y direction. A dark region 88A corresponds to an etching that is different than an etching in a lighter region 88B. The difference in the etching process in each region/domain can include masking, several etching steps, electrochemical and photochemical etching, and/or the like. Additionally, the difference in the etching process can include initially preparing the semiconductor layer 15 with a variation in the plurality of compositional inhomogeneous regions. For example, the variation in the plurality compositional inhomogeneous regions can be formed by patterning and masking or can be a byproduct of the Metalorganic Chemical Vapor Deposition (MOCVD) growth process. Due to the presence of compositional inhomogeneous regions, the areas having higher aluminum nitride content are etched at a higher rate that areas having a higher gallium nitride content.

Figure 27:
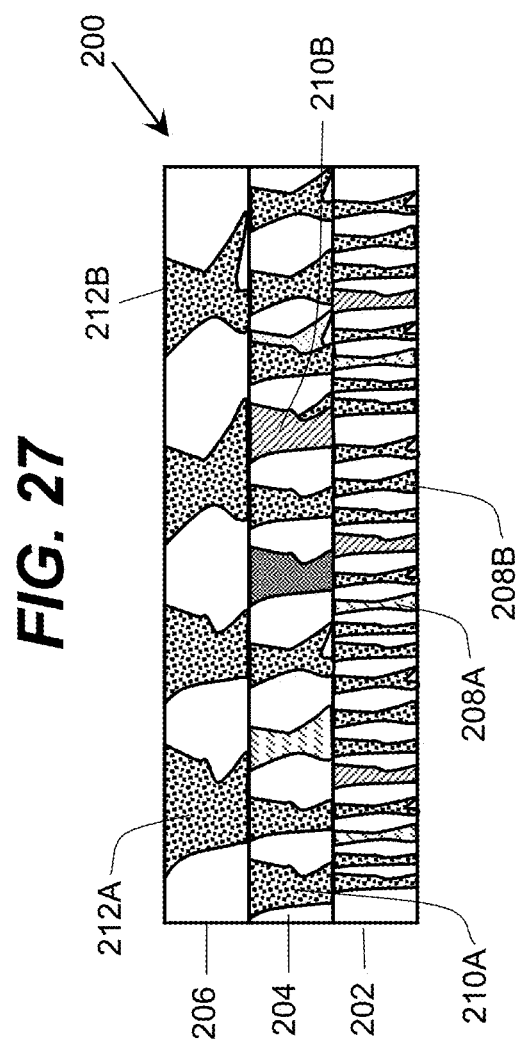
FIG. 27 shows an illustrative semiconductor structure having compositional inhomogeneous regions with variable characteristic sizes across the structure according to an embodiment.

FIG. 27 shows an illustrative semiconductor structure 200 having compositional inhomogeneous regions with variable characteristic sizes and shapes across the structure according to an embodiment. In one embodiment, the semiconductor structure 200 is a laminate semiconductor layer formed from a number of sub-layers. For example, as shown in FIG. 27, the semiconductor structure 200 includes sub-layers 202, 204 and 206. In one embodiment, the sub-layers 202, 204 and 206 can be epitaxially grown on one another. It is understood that the sub-layers 202, 204 and 206 in the semiconductor structure 200 are only illustrative and are not meant to limit the number of sub-layers that the semiconductor structure 200 can have in relation to the embodiment described herein.

As shown in FIG. 27, the sub-layer 202 can have compositional inhomogeneous regions 208A and 208B extending laterally across the sub-layer 202. In one embodiment, the compositional inhomogeneous regions 208A and 208B can have characteristic sizes and shapes that vary from each other. The variation in the characteristic sizes is illustrated in FIG. 27 by physical differences in sizes and through the use of shading the regions. It is understood that the amount of compositional inhomogeneous regions in the sub-layer 202 with variable characteristic sizes can differ from the amount illustrated in FIG. 27 and described herein, and thus, are not meant to limit this embodiment. Furthermore, although the compositional inhomogeneous regions 208A and 208B within the sub-layer 202 are shown in FIG. 27 having only a slightly variable composition, it is understood that these regions can have more or less variation in composition than that depicted in the figure.

The sub-layer 204 can have compositional inhomogeneous regions 210A and 2106 extending laterally across the sub-layer 204. The compositional inhomogeneous regions 210A and 2106 can have characteristic sizes and shapes that vary from each other. It is understood that the amount of compositional inhomogeneous regions in the sub-layer 204 with variable characteristic sizes and shapes can differ from the amount illustrated in FIG. 27 and described herein, and thus, are not meant to limit this embodiment. Furthermore, although the compositional inhomogeneous regions 210A and 2106 within the sub-layer 204 are shown in FIG. 27 having only a slightly variable composition from one another, it is understood that these regions can have more or less variation in composition.

As shown in FIG. 27, the sub-layer 206 can have compositional inhomogeneous regions 212A and 212B extending laterally across the sub-layer 206. Although the characteristics sizes and shapes of the compositional inhomogeneous regions 212A and 212B in the sub-layer 206 appear generally the same size and shape, the compositional inhomogeneous regions 212A and 212B can have characteristic sizes and shapes that vary from each other. It is understood that the amount of compositional inhomogeneous regions in the sub-layer 206 with variable characteristic sizes and shapes can differ from that illustrated in FIG. 27 and described herein, and thus, are not meant to limit this embodiment. Furthermore, although the compositional inhomogeneous regions 212A and 212B within the sub-layer 206 are shown in FIG. 27 having only a slightly variable composition from one another it is understood that these regions can have more or less variation in composition.

In one embodiment, the set of semiconductor sub-layers 202, 204 and 206 can contain inhomogeneous compositional inhomogeneous regions that differ in characteristic size throughout the semiconductor structure 200. For example, the compositional inhomogeneous regions 208A and 208B of the sub-layer 202 can have characteristic sizes that are smaller than the neighboring compositional inhomogeneous regions 210A and 210B of the sub-layer 204, while the compositional inhomogeneous regions 212A and 212B of the sub-layer 206 can have characteristic sizes that are larger than the compositional inhomogeneous regions in both the sub-layers 202 and 204. It is understood that the variation in the characteristic sizes of the compositional inhomogeneous regions across the semiconductor structure 200 are only illustrative, and other variations in the characteristic sizes of the compositional inhomogeneous regions are possible. For example, the compositional inhomogeneous regions 208A and 208B of the sub-layer 202 can have characteristic sizes that are larger than both the compositional inhomogeneous regions 210A and 210B of the sub-layer 204 and the compositional inhomogeneous regions 212A and 212B of the sub-layer 206. In another embodiment, the compositional inhomogeneous regions of the sub-layers 202, 204 and 206 can have characteristic shapes that vary across each sub-layer, as well as shapes that vary across all of the sub-layers.

Benefits of having a semiconductor structure with semiconductor sub-layers with compositional inhomogeneous regions of characteristic sizes and shapes that vary across the structure include, but are not limited to, optimizing the structure for stresses presented in the layers, as well as optimizing the structure with a variable density of threading dislocations. In addition, the presence of inhomogeneities can be used for some layers for carrier localization, whereas in other areas the presence of inhomogeneities can lead to an improved average transparency of a layer.

Figure 28A:
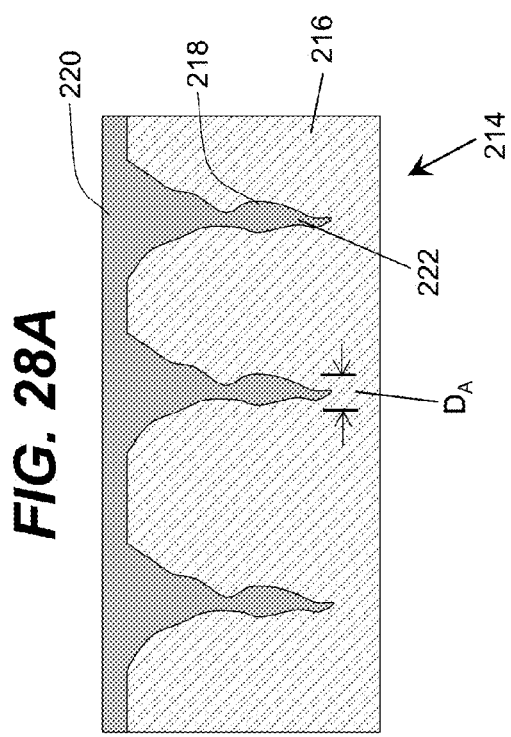
FIGS. 28A-28B show semiconductor structures that have been etched and filled with a metallic contact to form compositional inhomogeneous regions according to embodiments.
Figure 28B:
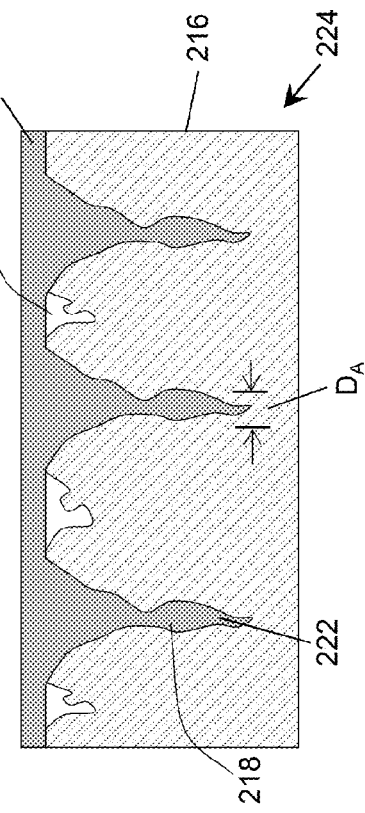

FIGS. 28A-28B show illustrative semiconductor structures that have been etched and filled with a metallic contact to form compositional inhomogeneous regions according to embodiments. In particular, FIG. 28A shows a semiconductor structure 214 with a semiconductor layer 216 that has been etched with pores 218 that eventually form the compositional inhomogeneous regions. In one embodiment, a wet etching can be used to form the etched pores 218. It is understood that other types of etching operations such as dry etching can be used to form the etched pores 218. Regardless, the etching of group III nitride semiconductor layers using either wet etching or dry etching is well known in the art.

After etching, the etched pores 218 can be filled by a metallic contact 220, which can include, but is not limited to, titanium, nickel, aluminum, chromium and/or combinations thereof. In one embodiment, the contact can comprise a layered structure. In another embodiment, the metallic contact 220 can be filled in the etched pores 218 of the semiconductor layer 216 by evaporation. It is understood that other operations such as ion beam sputtering can be used to fill the etched pores 218 with the metallic contact 220.

As shown in FIG. 28A, the metallic contact 220 penetrates the semiconductor layer 216 to form the compositional inhomogeneous regions 222. The compositional inhomogeneous regions 222 can each have a characteristic lateral domain size, $D_A$. This characteristic lateral domain size $D_A$, of each of the compositional inhomogeneous regions 222 can be used to form regions that have variation in their lateral domain sizes. Having the compositional inhomogeneous regions 222 in the semiconductor layer 216 with varying lateral domain sizes allows for selective etching of domains containing inhomogeneities.

FIG. 28B shows a shows a semiconductor structure 224 similar to the structure 214 of FIG. 28A, except that the semiconductor structure 224 includes metallic domains 226 formed in the semiconductor layer 216 proximate the metallic contact 220. In one embodiment, the metallic domains 226 can include, but are not limited to, aluminum. In general, some of the metallic domains 226 can comprise reflective material to the target radiation. In another embodiment, the metallic domains 226 can be filled with reflective, transparent or scattering material. Examples of reflective material that can be filled with the metallic domains 226 include, but are not limited to, rhodium or aluminum. Examples of transparent material that can be filled with the metallic domains 226 include, but are not limited to, $SiO_2$, AAO, $CaF_2$, $MgF_2$, or a thin layer of hafnium. Examples of scattering material that can be filled with the metallic domains 226 include, but are not limited to, nano-particles of an ultraviolet transparent material.

The metallic domains 226 can be formed in the semiconductor layer 216 proximate the metallic contact 220 by evaporation. It is understood that other operations such as sputtering can be used to form the metallic domains 226.

Having the metallic domains 226 in the semiconductor layer 216 proximate the metallic contact 220 can improve the light extraction from optoelectronic devices, such as ultraviolet light emitting diodes. It is understood that the sizes, shapes, and locations of the metallic domains 226 can vary.

Figure 29:
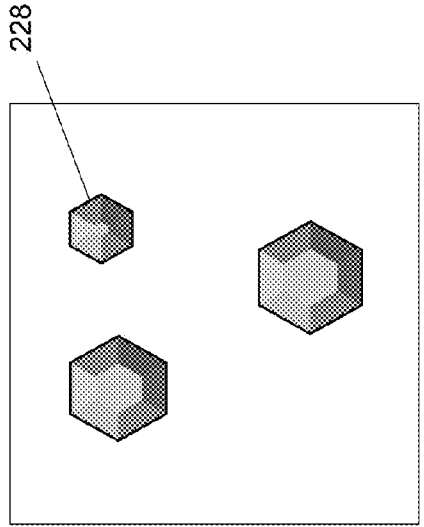
FIG. 29 shows an example of a shape that the compositional inhomogeneous regions depicted in the semiconductor structures of FIGS. 28A-28B can have according to an embodiment.

FIG. 29 shows an example of a shape that the compositional inhomogeneous regions 222 in the semiconductor structures of FIGS. 28A-28B can have according to an embodiment. As shown in FIG. 29, the etched identification for the compositional inhomogeneous regions can have a hexagonal shape. In this manner, the etched domains that form the compositional inhomogeneous regions will have hexagonal indentations 228. In this embodiment, the hexagonal indentations 228 are formed due to a wurtzite crystal structure of the semiconductor layers that form the semiconductor structure. The size and depth of the hexagonal indentations 228 can depend both on the composition of the semiconductor layer at the etched location and the details of the etching process that are used for etching the structure. In one embodiment, the hexagonal indentations 228 can be partially filled by reflective/scattering media such as, for example, aluminum or rhodium. This can result in improved light extraction for optoelectronic devices, such as for example, light emitting devices that are based on semiconductors structures that utilize the aforementioned compositional inhomogeneous regions.

Figure 30A:
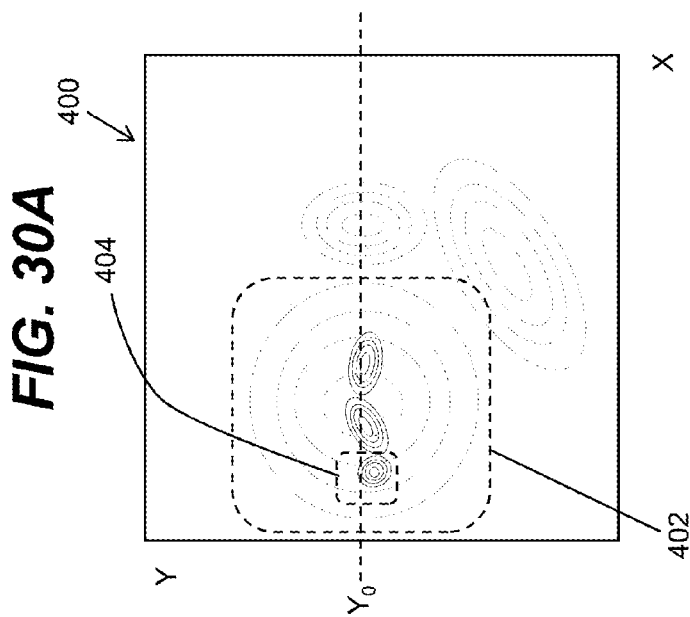
FIGS. 30A and 30B show the distribution of inhomogeneities containing two scales for a semiconductor layer according to an embodiment.
Figure 30B:
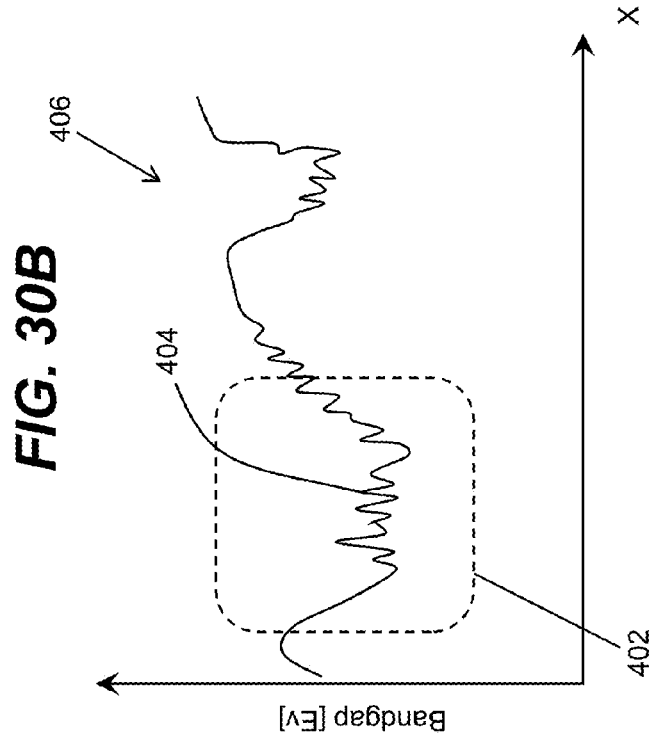

Another embodiment of the present invention is illustrated in FIGS. 30A-30B. In particular, FIGS. 30A-30B show the distribution of inhomogeneities in a semiconductor layer, which can comprise a p-type layer, an electron blocking layer, or barrier and quantum well sub-layers within an active layer according to two scales. In FIG. 30A, the distribution of inhomogeneities are depicted as a contour map 400. In particular, the contour map 400 illustrates the bandgap variation of the inhomogeneities in the layer, with the lines of the contours representative of values of a constant bandgap. As shown in FIG. 30A, the bandgap variation of the inhomogeneities can include large domains 402 and small domains 404. Although FIG. 30A depicts only one large domain 402 and one small domain 404 for purposes of clarity, it is understood that a contour map for the distribution of inhomogeneities of a layer can have additional large and small domains. In one embodiment, the large domains 402 can include valleys or hills that represent the inhomogeneities distribution, while the small domains 404, which are superimposed over the large domains can also include valleys or hills that represent the inhomogeneities distribution, but in a more specific location within a large domain. In one embodiment, the large domains 402 provide a first scale, while the small domains 404 provide a second scale. In this manner, the first scale of the large domains and the second scale of the small domains 404 can be used for the localization of carriers, carrier trapping, carrier conductivity, optical transparency, and/or the like.

In FIG. 30B, the distribution of inhomogeneities are depicted in a plot 406 of bandgap 400 versus a range of values of X. In particular, the plot 406 shows a representative cut of the bandgap variation of the inhomogeneities in the layer at a constant value $Y=Y_0$, for a range of values of X, where X and Y are the lateral spatial coordinates of the layer. Like FIG. 30A, the bandgap variation of the inhomogeneities depicted in FIG. 30B can include large domains 402 and small domains 404 to represent the fluctuations of the inhomogeneities in the layer. The large domains 402 correspond to large valley/hill regions and are representative of a first scale, while the small domains 404 correspond to finer valley/hill regions and are representative of a second scale.

In one embodiment, the scales can be measured, for example, by computing local averages of bandgaps within each sub-unit of area Ai of the layer. For example, one can first start by subdividing the area by large sub-regions Al and calculating the average bandgap on each sub-region to determine the large scale. Then finer subdivision of an area and calculation of average bandgap for each region can yield details about the finer scales. In this manner, the large scale inhomogeneity can be selected such that its characteristic size is smaller than an inverse of a dislocation density for the semiconductor layer. This can result in localization of carriers away from threading dislocation cores.

Figure 31B:
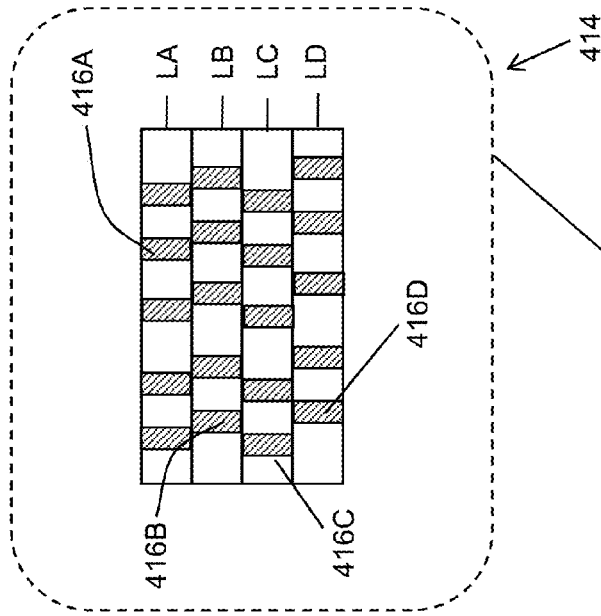
FIGS. 31A-31C show examples of distributions of sets of transparent regions and sets of conductive regions within different layers of a semiconductor structure with the regions having periodic structures that are spatially-shifted between neighboring layers according to an embodiment.
Figure 31A:
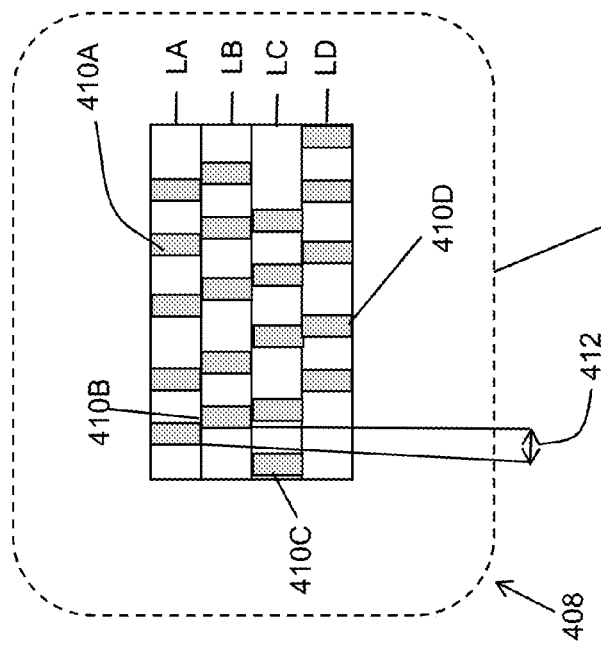
Figure 31C:
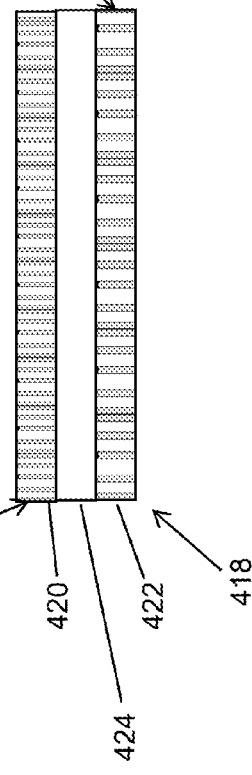

FIGS. 31A-31C illustrate another embodiment of the present invention. In particular, FIGS. 31A-31C show examples of arrangements of a set of transparent regions and a set of conductive regions within different layers of a semiconductor with the sets having periodic structures that are spatially-shifted between neighboring layers according to an embodiment. For example, in one embodiment illustrated in FIG. 31A, a semiconductor 408 can include a laminate of layers LA, LB, LC and LD. It is understood that the layers LA, LB, LC and LD in the laminate depicted in FIG. 31A are only illustrative of one possible configuration and are not meant to limit the scope and breadth of the embodiments described herein. The laminate of layers LA, LB, LC and LD can each include a set of transparent regions 410. As shown in FIG. 31A, the layer LA has transparent regions 410A, the layer LB has transparent regions 410B, the layer LC has transparent regions 410C, and the layer LD has transparent regions 410D.

The transparent regions in each of the layers LA, LB, LC and LD can be structured laterally along the layer in a periodic distribution. In one embodiment, the transparent regions are spatially phase-shifted in relation to the periodic distribution of the transparent regions in immediately adjacent or neighboring layers. As used herein, a periodic distribution means a distribution that can have a characteristic length scale distance between regions in a layer, and have a characteristic length scale of the region, wherein the characteristic length scale can be obtained by examining the average length scale and standard deviation from such length scale. This definition of a periodic distribution also covers semi-periodic distributions. The periodic distribution regions within layers LA, LB, LC and LD of semiconductor 408 can be obtained through patterning, or semiconductor layer overgrowth. In another embodiment, the periodic distribution can be obtained by selecting a particular epitaxial growth method, such as a three-dimensional epitaxial growth approach which is well-known in art.

As shown in FIG. 31A, the periodic distribution of the transparent regions 410A in the layer LA is shifted relative to the periodic distribution of the transparent regions 410B in the layer LB by a value defined as a phase shift. In FIG. 31A, the phase shift between the transparent regions 410A in the layer LA and the transparent regions 410B in the layer LB is represented by the spacing 412. The phase shift can be selected to promote light extraction efficiency from the device. In one embodiment, the spatial phase-shift of the set of transparent regions in the layers LA, LB, LC and LD can be uniform. In another embodiment, the spatial phase-shift of the set of transparent regions in the semiconductor layers can vary in periodicity among neighboring layers. Generally, the phase shift can be selected to promote light extraction efficiency from the light emitting device within which the structure of this embodiment is configured.

FIG. 31B is similar to FIG. 31A, except that the semiconductor 414 of this figure can include a set of conductive regions 416 in each of the laminate of layers LA, LB, LC and LD. In this manner, the layer LA has conductive regions 416A, the layer LB has conductive regions 416B, the layer LC has conductive regions 416C, and the layer LD has conductive regions 416D. The conductive regions in each of the layers LA, LB, LC and LD are structured laterally along the layer in a periodic distribution. In one embodiment, the conductive regions are spatially phase-shifted in relation to the periodic distribution of the conductive regions in immediately adjacent or neighboring layers. It is understood that the phase shift of the conductive regions can be the same or different for each of layers LA, LB, LC and LD, and in general, such shift can be selected to yield the best conductivity of the semiconductor layer.

The laminate of layers of the semiconductor are not meant to be limited to having either only a set of transparent regions in the layers or only a set of conductive regions as illustrated in FIGS. 31A-31B, respectively. In one embodiment, the layers of the semiconductor can contain both periodic distributions of transparent regions and conductive regions in the layers. Alternatively, in another embodiment, the layers of the semiconductor can contain both transparent regions and conductive regions, wherein the transparent regions and the conductive regions are structured laterally along a layer in a periodic distribution.

FIG. 31C shows another embodiment in which the laminate semiconductor heterostructures 408 and 414 shown in FIGS. 31A and 31B, respectively can be used as a component of a larger semiconductor heterostructure 418. In one embodiment, as shown in FIG. 31C, the heterostructure 418 can include a first layer 420 comprising the semiconductor laminate structure 408 shown in FIG. 31A, a second layer 422 comprising the semiconductor laminate structure 414 structure shown in FIG. 31B, and a third layer 424 which can include a homogeneous layer of homogeneous semiconductor composition formed between layers 420 and 422. In another embodiment, the heterostructure 418 can include a first layer 420 comprising the semiconductor laminate structure 408 shown in FIG. 31A, a second layer 422 also comprising the semiconductor laminate structure 408 structure shown in FIG. 31A, separated by the third layer 424. It is understood, that these examples of arrangements of laminate semiconductor heterostructures are only illustrative of a few configurations and those skilled in the art will appreciate that other arrangements of structures are possible and within the scope of the various embodiments described herein.

FIG. 32 shows a semiconductor heterostructure 426 grown over a substrate 12 having roughness elements 428 on an exterior side surface 430 of the substrate according to an embodiment. In one embodiment, the roughness elements 428 can be configured to improve light extraction from the semiconductor heterostructure 426 and any optoelectronic device, such as an ultraviolet light emitting diode, that can include the heterostructure 426. As shown in FIG. 32, the roughness elements 428 can be formed on the exterior side surface 430 of the substrate 12 that is opposite a side surface near the interface of the substrate 12 and a semiconductor buffer layer 432 that can be epitaxially grown on the substrate, which can also have roughness elements 428 formed in an interior portion thereof. The buffer layer 432 can comprise an AlGaN layer, and in a particular embodiment, the buffer layer can comprise an AlN layer. In yet another embodiment the buffer layer 432 can contain sublayers having a variation in an aluminum nitride molar ratio or in a V/III ratio used for their epitaxial growth.

The size and shape of the roughness elements 428 in the substrate 12 and the buffer layer 432 can be optimized to improve light extraction from the semiconductor heterostructure 426 and the device that includes the heterostructure. In one embodiment, the roughness elements 428 can include etched domains having a characteristic size that is at least a wavelength of target radiation, such as a peak wavelength of the radiation emitted by the semiconductor heterostructure 426. For example, the etched domains of the roughness elements 428 can include truncated pyramids, inverted pyramids, conical elements, and/or the like. The roughness elements 428 can also include, but are not limited to, protrusions. In one embodiment, the roughness elements 428 can include externally deposited roughness elements comprising shapes of $Al_2O_3$, $SiO_2$, and/or the like. Furthermore, although FIG. 32 shows the roughness elements 428 formed on the side surface 430 of the substrate 12, it is possible to have the roughness elements formed in other locations about the substrate such as within its internal portion, on a facing portion, an edge portion, and/or the like. Similarly, the roughness elements 428 formed on the interior of the layer 432 can be formed on other locations such as a facing portion, an edge portion, and/or the like.

In another embodiment, the roughness elements 428 can be patterned. In this manner, the patterned roughness elements 428 can have a periodic structure or an aperiodic structure. In an embodiment, the patterned roughness elements 428 can form photonic crystals each having a characteristic size that is comparable to the wavelength of the target radiation (e.g., the peak radiation emitted by the semiconductor heterostructure 426). As used herein, a characteristic size that is comparable means a characteristic size within +/−50% of the wavelength of the target radiation. The roughness elements 428 can be patterned using well-known techniques that can include, but are not limited to, etching, deposition, and the like.

As shown in FIG. 32, the semiconductor heterostructure 426 can further include other semiconductor layers grown on the substrate 12 and the buffer layer 432, such as layers 434, 436, 438, 440, 442, 444, 446, and 448. For example, the layers 434 and 440 can include sets of transparent regions and conductive regions according to any one of the various arrangements discussed above with regard to FIGS. 31A-31C. In this manner, each of the sets of transparent regions and conductive regions that can be deployed with the layers 434 and 440 can be formed with characteristic sizes and distances between such regions in a layer and in immediately adjacent layers that are selected to optimize overall efficiency (e.g., wall plug) of the semiconductor heterostructure 426 and the device that can include the heterostructure.

Figure 33:
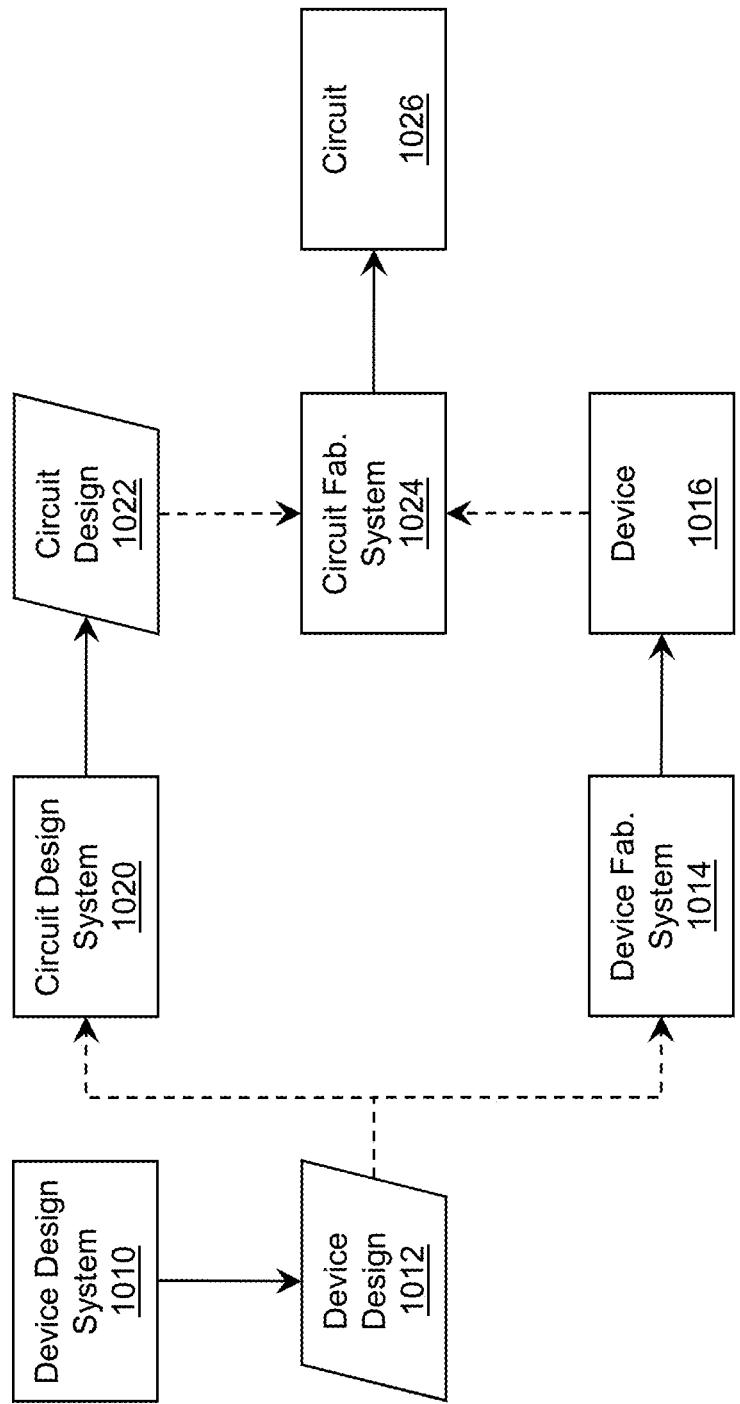
FIG. 33 shows an illustrative flow diagram for fabricating a circuit according to an embodiment.

In one embodiment, the invention provides a method of designing and/or fabricating a circuit that includes one or more of the devices designed and fabricated as described herein (e.g., including one or more devices fabricated using a semiconductor structure described herein). To this extent, FIG. 33 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
a semiconductor layer comprising a plurality of compositional inhomogeneous regions, wherein a difference between an average band gap for the plurality of compositional inhomogeneous regions and an average band gap for a remaining portion of the semiconductor layer is at least 26 meV, wherein a characteristic size of each of the plurality of compositional inhomogeneous regions is smaller than an inverse of a dislocation density for the semiconductor layer, and wherein the plurality of compositional inhomogeneous regions includes large scale compositional inhomogeneous regions and small scale inhomogeneous regions, the large scale compositional inhomogeneous regions having large lateral areas and the small scale compositional inhomogeneous regions having small lateral areas, wherein the large scale compositional inhomogeneous regions are larger than the square of a characteristic distance between threading dislocations and the small scale compositional inhomogeneous regions are smaller than the square of the characteristic distance between the threading dislocations.

2. The device of claim 1, wherein a characteristic distance between each dislocation is greater than a smallest characteristic size for a compositional inhomogeneous region.

3. The device of claim 1, wherein an average distance between the compositional inhomogeneous regions is less than an ambipolar diffusion length.

4. The device of claim 1, wherein the average band gap for the plurality of compositional inhomogeneous regions comprises an energy of at least one optical phonon.

5. The device of claim 1, wherein the semiconductor layer includes a first side and a second side, and wherein a distribution of the plurality of compositional inhomogeneous regions is graded, such that the first side has an average band gap higher than an average band gap of the second side.

6. The device of claim 1, wherein the plurality of compositional inhomogeneous regions form a periodic structure, and wherein the plurality of compositional inhomogeneous regions comprise one of: a set of transparent regions or a set of conductive regions.

7. The device of claim 1, wherein the semiconductor layer comprises a plurality of sub-layers, wherein at least two sub-layers contain compositional inhomogeneous regions forming a periodic structure, wherein the compositional inhomogeneous regions in each of the at least two sub-layers are shifted relative to the compositional inhomogeneous regions in an immediately adjacent sub-layer, and wherein one of the sub-layers that contains compositional inhomogeneous regions comprises a set of transparent regions and another one of the sub-layers that contains compositional inhomogeneous regions comprises a set of conductive regions.

8. The device of claim 1, wherein the semiconductor layer comprises a plurality of sub-layers, wherein each of the plurality of inhomogeneous regions has a variable characteristic size across the set of the sub-layers.

9. The device of claim 1, wherein the semiconductor layer includes a bandgap variation having at least two characteristic size scales.

10. The device of claim 1, further comprising a metallic contact for the semiconductor layer, wherein the metallic contact includes a plurality of metallic protrusions extending into the semiconductor layer.

11. The device of claim 10, wherein semiconductor layer is etched prior to deposition of the metallic contact, and wherein the plurality of metallic protrusions are deposited into vacant domains within the semiconductor layer after being etched.

12. The device of claim 11, wherein the semiconductor layer comprises a plurality of sub-layers, wherein the vacant domains are variable in lateral size across a thickness of the plurality of sub-layers.

13. The device of claim 1, wherein a lateral area for the plurality of compositional inhomogeneous regions is smaller than a square of a characteristic distance between threading dislocations.

14. A device, comprising:
a semiconductor structure including an active region, wherein the active region comprises a multiple quantum well structure including:
a plurality of barriers alternating with a plurality of quantum wells, wherein at least one of: a barrier in the plurality of barriers or a quantum well in the plurality of quantum wells includes a plurality of compositional inhomogeneous regions, wherein a difference between an average band gap for the plurality of compositional inhomogeneous regions and an average band gap for a remaining portion of the semiconductor layer is at least 26 meV, wherein a characteristic size of each of the plurality of compositional inhomogeneous regions is smaller than an inverse of a dislocation density for the semiconductor layer, and wherein a lateral area for the plurality of compositional inhomogeneous regions is smaller than a square of a characteristic distance between threading dislocations.

15. The device of claim 14, wherein a characteristic size of the plurality of compositional inhomogeneous regions is smaller than $1/N_{reg}^{0.5}$, where $N_{reg}$ is the average density of the compositional inhomogeneous regions per unit area.

16. The device of claim 14, wherein the plurality of compositional inhomogeneous regions includes large scale compositional inhomogeneous regions and small scale inhomogeneous regions, the large scale compositional inhomogeneous regions having large lateral areas and the small scale compositional inhomogeneous regions having small lateral areas, wherein the large scale compositional inhomogeneous regions are larger than the square of a characteristic distance between the threading dislocations and the small scale compositional inhomogeneous regions are smaller than the square of the characteristic distance between the threading dislocations.

17. The device of claim 16, wherein the large scale and small scale compositional inhomogeneous regions have an energy depth that is greater than 26 meV.

18. A method, comprising:
   forming an active region of a semiconductor structure, wherein the active region comprises a light emitting heterostructure, the forming including:
      forming a plurality of barriers alternating with a plurality of quantum wells, wherein forming at least one of: a barrier in the plurality of barriers or a quantum well in the plurality of quantum wells includes forming a plurality of compositional inhomogeneous regions, wherein an average band gap for the plurality of compositional inhomogeneous regions exceeds 26 meV, and a characteristic size for each compositional inhomogeneous region is smaller than an inverse of a dislocation density, and wherein a lateral area for the plurality of compositional inhomogeneous regions is smaller than a square of a characteristic distance between threading dislocations.

19. The method of claim 18, wherein forming the plurality of compositional inhomogeneous regions includes at least one of: adjusting a V/III ratio, adjusting a growth temperature, or adjusting a composition during epitaxial growth of the at least one of: the barrier in the plurality of barriers or the quantum well in the plurality of quantum wells.

20. The method of claim 18, wherein the plurality of compositional inhomogeneous regions includes large scale compositional inhomogeneous regions and small scale inhomogeneous regions, the large scale compositional inhomogeneous regions having large lateral areas and the small scale compositional inhomogeneous regions having small lateral areas, wherein the large scale compositional inhomogeneous regions are larger than the square of a characteristic distance between threading dislocations and the small scale compositional inhomogeneous regions are smaller than the square of the characteristic distance between the threading dislocations.

* * * * *